US012068035B2

(12) United States Patent
Dong

(10) Patent No.: US 12,068,035 B2
(45) Date of Patent: Aug. 20, 2024

(54) MEMORY, PROGRAMMING METHOD THEREFOR AND MEMORY SYSTEM

(71) Applicant: YANGTZE MEMORY TECHNOLOGIES CO., LTD., Wuhan (CN)

(72) Inventor: Zhipeng Dong, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 155 days.

(21) Appl. No.: 17/944,658

(22) Filed: Sep. 14, 2022

(65) Prior Publication Data

US 2023/0343398 A1  Oct. 26, 2023

(30) Foreign Application Priority Data

Apr. 21, 2022 (CN) .......................... 202210426359.X

(51) Int. Cl.
| | | |
|---|---|---|
| *G11C 16/34* | (2006.01) | |
| *G11C 16/04* | (2006.01) | |
| *G11C 16/08* | (2006.01) | |
| *G11C 16/10* | (2006.01) | |
| *G11C 16/24* | (2006.01) | |

(52) U.S. Cl.
CPC ........ *G11C 16/102* (2013.01); *G11C 16/0433* (2013.01); *G11C 16/08* (2013.01); *G11C 16/24* (2013.01)

(58) Field of Classification Search
CPC .................................................. G11C 16/3459
See application file for complete search history.

(56) References Cited

U.S. PATENT DOCUMENTS

2017/0242632 A1* 8/2017 Cho ...................... G06F 3/0655

* cited by examiner

*Primary Examiner* — Jason Lappas
(74) *Attorney, Agent, or Firm* — BAYES PLLC

(57) ABSTRACT

A memory, a programming method, and a memory system are provided. The programming method includes programming a selected memory cell string according to a programming sequence; applying, when programming a memory cell in the selected memory cell string that is coupled to a selected non-edge word line in a plurality of word lines, a first pass voltage to edge word lines in the plurality of word lines; and applying a second pass voltage to a non-edge word line adjacent to the edge word lines. The edge word lines are at least one word line in the plurality of word lines adjacent to the source line or to the bit line; the non-edge word lines are word lines in the plurality of word lines other than the edge word lines; and the selected non-edge word line is not adjacent to the edge word lines.

14 Claims, 16 Drawing Sheets

MEMORY, PROGRAMMING METHOD THEREFOR AND MEMORY SYSTEM

CROSS-REFERENCE TO RELATED APPLICATION

The present application claims the benefit of priority to China Patent Application No. CN 202210426359.X, filed on Apr. 21, 2022, the content of which is incorporated herein by reference in its entirety.

TECHNICAL FIELD

The present disclosure relates to the field of memory, in particular, to a memory, a programming method therefor, and a memory system.

BACKGROUND

Nonvolatile memories have been widely applied in electronic devices in various fields. Flash memory is one of the most widely used electrically erasable and re-programmable nonvolatile memories. Flash memories may include memories of NOR and NAND architectures, in which a threshold voltage of each memory cell of the flash memory is modified to a desired level to implement various operations such as reading, programming, and erasing. Upon operating on flash memory, the erase operation may be performed on a block level, the programming operation may be performed on a page level, and the read operation may be performed on a memory cell level. At present, NAND flash memories of the planar structure have been widely applied. In order to further improve the storage capacity of flash memories, three-dimensional (3D) NAND memory has been proposed with a structure including a substrate; a stack structure disposed on the substrate; several channel holes through the stack structure; memory structures in channel holes, each including a charge storage layer on the sidewall surface of the channel hole and a channel layer on the sidewall surface of the charge storage layer, where the intersection between the memory structure in each channel hole and each control gate corresponds to a memory cell. For the 3D NAND with this structure, while programming a certain layer of memory cells in a certain channel hole, there may exist program disturb of a hot carrier injection (HCI) type to other layers of memory cells in other channel holes.

SUMMARY

In view of this, the main object of the present disclosure is to provide a memory and a programming method therefor, and a memory system, in which a pass voltage smaller than that on adjacent word lines is applied to the unselected word lines that are affected severely by program disturb to reduce voltage difference, and in turn to reduce HCI type disturb on memory cells coupled to unselected word lines during 3D non-volatile memory programming.

In order to achieve the above-mentioned objective, the technical solution of the present disclosure is implemented as follows.

In a first aspect, an embodiment of the present disclosure provides a programming method for a memory, where the memory comprises: a plurality of memory cell strings each connecting with a bit line at one end and with a source line at the other end and comprising a plurality of memory cells connected in series; where the plurality of memory cells are coupled with a plurality of word lines respectively; and the programming method comprises: programming a selected memory cell string according to the programming sequence; applying, when programming a memory cell in the selected memory cell string that is coupled to a selected non-edge word line in the plurality of word lines, a first pass voltage to edge word lines in the plurality of word lines; applying a second pass voltage to a non-edge word line adjacent to the edge word lines, where the edge word lines are at least one word line in the plurality of word lines adjacent to the source line or at least one word line in the plurality of word lines adjacent to the bit line; the non-edge word lines are word lines in the plurality of word lines other than the edge word lines; the selected non-edge word line is not adjacent to the edge word lines; and the first pass voltage is less than the second pass voltage.

In a second aspect, an embodiment of the present disclosure further provides a memory, where the memory includes a memory array including a plurality of memory cell strings, each string connects with a bit line at one end and with a source line at the other end, and each string includes a plurality of memory cells connected in series, where the plurality of memory cells are coupled with a plurality of word lines respectively; and a control circuit coupled to the memory array for controlling the memory array, where the control circuit is configured to: program a selected memory cell string according to the programming sequence;
  apply, when programming a memory cell in the selected memory cell string that is coupled to a selected non-edge word line in the plurality of word lines, a first pass voltage to edge word lines in the plurality of word lines; apply a second pass voltage to a non-edge word line adjacent to the edge word lines, where the edge word lines are at least one word line in the plurality of word lines adjacent to the source line or at least one word line in the plurality of word lines adjacent to the bit line; the non-edge word lines are word lines in the plurality of word lines other than the edge word lines; the selected non-edge word line is not adjacent to the edge word lines; and the first pass voltage is less than the second pass voltage.

In a third aspect, an embodiment of the present disclosure further provides a memory system including the aforementioned memory; and a memory controller coupled to the memory and configured to control the memory.

Embodiments of the present disclosure provide a memory and a programming method thereof and a memory system. Here, the memory includes a plurality of memory cell strings each including a plurality of memory cells connected in series; where the plurality of memory cells are respectively coupled with a plurality of word lines. The programming method includes: programming a selected memory cell string according to a programming sequence; applying, when programming a memory cell in the selected memory cell string that is coupled to a selected non-edge word line in the plurality of word lines, a first pass voltage to edge word lines in the plurality of word lines; applying a second pass voltage to a non-edge word line adjacent to the edge word lines; where the edge word lines are at least one word line in the plurality of word lines adjacent to the source line or at least one word line in the plurality of word lines adjacent to the bit line; the non-edge word lines are word lines in the plurality of word lines other than the edge word lines; the selected non-edge word line is not adjacent to the edge word lines; and the first pass voltage is less than the second pass voltage. With the memory and the programming method, and the memory system provided in embodiments of the present disclosure, by applying a pass voltage smaller than that applied on an adjacent non-edge word line (e.g., word line WL2) on edge word lines (e.g., WL0 and WL1), the potential difference between adjacent edge word line and adjacent non-edge word line (e.g., word lines WL1 and WL2) is reduced, thereby reducing disturb of HCI type on edge word lines (e.g., word line WL1) during programming non-adjacent non-edge word lines (e.g., word line WL3).

BRIEF DESCRIPTION OF DRAWINGS

In the figures drawn not necessarily to scale, same reference numerals may describe similar parts in different views. Same numerals with different character suffixes may represent different instances of similar parts. The accompanying drawings illustrate various embodiments discussed in the present document in general by example rather than limitation.

DETAILED DESCRIPTION

Figure 1:
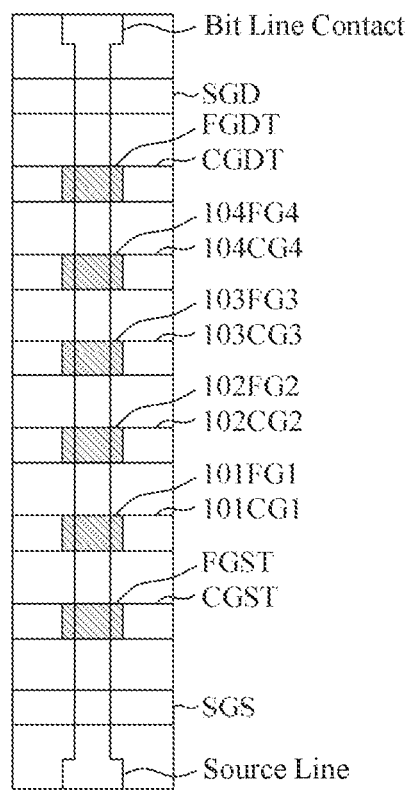
FIG. 1 is a structure diagram of a NAND string provided in an embodiment of the present disclosure.

Embodiments of the present disclosure will be described in greater detail below with reference to the drawings. Other embodiments that may serve as variants of any disclosed embodiments may be formed by differently configuring or arranging elements and features in the present disclosure. Therefore, the present disclosure is not limited to embodiments described in the description. In contrast, the described embodiments are provided to make the present disclosure thorough and complete and to convey the scope of the present disclosure fully to those skilled in the art of the present disclosure. It is noted that references to "embodiment" and "another embodiment" do not necessarily refer to only one embodiment, and different references to any such phrases do not refer to the same embodiment. It should be understood that although terms "first", "second" and "third" etc. may be used herein to identify various elements, these elements are not limited by these terms. These terms are used to distinguish one element from another element with the same or similar name. Therefore, a first element in one embodiment may also be referred to as a second or third element in another embodiment without departing from the spirit and scope of the disclosure.

The accompanying drawings are not necessarily drawn to scale and may be in enlarged scale to clearly illustrate features of embodiments in certain cases. When an element is described as connected or coupled to another element, it should be understood that the former may be directly connected or coupled to the latter, or may be electrically connected or electrically coupled to the latter via one or more intermediate elements therebetween. Further, it should be understood that while an element is said to be "between" two elements, the element may be the only one element between the two elements, or there may be one or more intermediate elements.

Terms as used herein are only for the purpose of describing certain embodiments rather than limiting the present disclosure. Singular forms as used herein are intended to include plural forms unless otherwise stated in the context. The articles "a" and/or "an" as used in the present disclosure and the appended claims should be explained as "one or more" unless stated otherwise or clearly understood as singular forms from the context. It should be further understood that terms "include", "including", "comprise" and "comprising" as used in the present disclosure means the presence of the elements but do not exclude the presence or addition of one or more other elements. The term "and/or" as used in the present disclosure includes any and all combinations of one or more related listed items. Unless otherwise defined, all terms related to technology and science as used in the present disclosure have the same meanings as understood by those of ordinary skill in the art in view of the present disclosure. It should be further understood that unless clearly defined in the present disclosure, terms should be explained as having meanings consistent with meanings in the contexts of the present disclosure and related technology such as defined in common dictionaries rather than being explained in an ideal manner or too formally.

In the following description, many specific details are set forth to provide a thorough understanding of the present disclosure. However, the present disclosure may be practiced without some or all of the specific details. In other cases, known processing structures and/or processing are not described in detail to avoid obscuring the present disclosure unnecessarily. It should be further understood that in certain cases, unless otherwise stated, it should be obvious to those skilled in the art that features or elements described with respect to one embodiment may be used separately or in combination with other features or elements in another embodiment. In the following, embodiments of the present disclosure will be described in detail with reference to accompanying drawings. The following description focuses on details to facilitate understanding embodiments of the present disclosure. Well-known technical details may be omitted to avoid obscuring features and aspects of the present disclosure.

The present disclosure will be described in more detail below with respect to accompanying drawings and specific embodiments.

Figure 2:
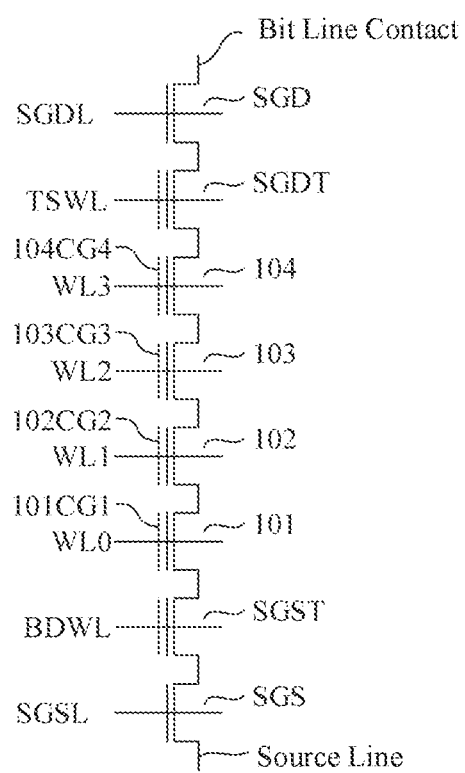
FIG. 2 is an equivalent circuit diagram of a NAND string according to an embodiment of the present disclosure.

FIG. 1 is a structure diagram of a NAND string provided in an embodiment of the present disclosure, and FIG. 2 is an equivalent circuit diagram of the NAND string shown in FIG. 1. In the flash system of the NAND structure, a plurality of transistors are arranged in series and sandwiched between two select gates (source gate and drain gate), and the series connected transistors and the two select gates are referred to as a NAND string. The NAND string shown in FIGS. 1 and 2 includes a top select gate SGD (on the drain side), a bottom select gate SGS (on the source side), and a top dummy transistor SGDT, four transistors 101-104, and a bottom preset transistor SGST sandwiched between them. The top select gate SGD connects the NAND string to the bit line through the bit line contact and is controlled by applying appropriate voltages to the top select gate line SGDL. The bottom select gate SGS connects the NAND string to the source line and is controlled by applying appropriate voltages to the bottom select gate line SGSL. Each of the top dummy transistor SGDT, the four transistors 101-104, and the bottom preset transistor SGST contains a control gate and a floating gate. For example, the top dummy transistor SGDT includes a control gate CGDT and a floating gate FGDT; the transistor 101 includes a control gate 101CG1 and a floating gate 101FG1; the transistor 102 includes a control gate 102CG1 and a floating gate 102FG1; the transistor 103 includes a control gate 103CG1 and a floating gate 103FG1; the transistor 104 includes a control gate 105(B)G1 and a floating gate 105(E)G1; and the bottom dummy transistor SGST includes a control gate CGST and a floating gate FGST. The control gate CGST is connected with the bottom dummy word line BDWL; the control gate 101CG1-the control gate 105(B)G1 are connected with word lines WL0-WL3 respectively; and the control gate CGDT is connected with the top dummy word line TSWL.

It is to be noted that FIGS. 1 and 2 only illustratively show four memory cells (transistors 101-104) for read/write operations and two dummy memory cells (top dummy transistor SGDT and bottom preset transistor SGST) for read/write test in the NAND string. In practical applications, the NAND string may include 8, 16, 32, 64, or 128 memory cells, etc. That is, the number of memory cells or dummy memory cells in the NAND string does not limit the scope of the present disclosure. Furthermore, the typical structure of a flash system employing the NAND structure includes a plurality of NAND strings. Each NAND string is connected to a source line through a bottom select gate SGS controlled by a bottom select gate line SGSL, and to a respective bit line through a top select gate SGD controlled by a top select gate line SGDL. Each bit line and the respective NAND string(s) connected thereto through bit line contact form a column in the memory cell array. A bit line is shared by a plurality of NAND strings. Typically, a bit line extends on top of a NAND string in a direction perpendicular to a word line and is connected to one or more sense amplifiers. It should be understood that in the present disclosure the structures in FIGS. 1 and 2 are used only as examples to illustrate the structure of a NAND string, and in practical applications, the charge trapping layer is not necessarily a floating gate, but may also be a trapping nitride layer, a non-conductive dielectric material, etc.

Figure 3:
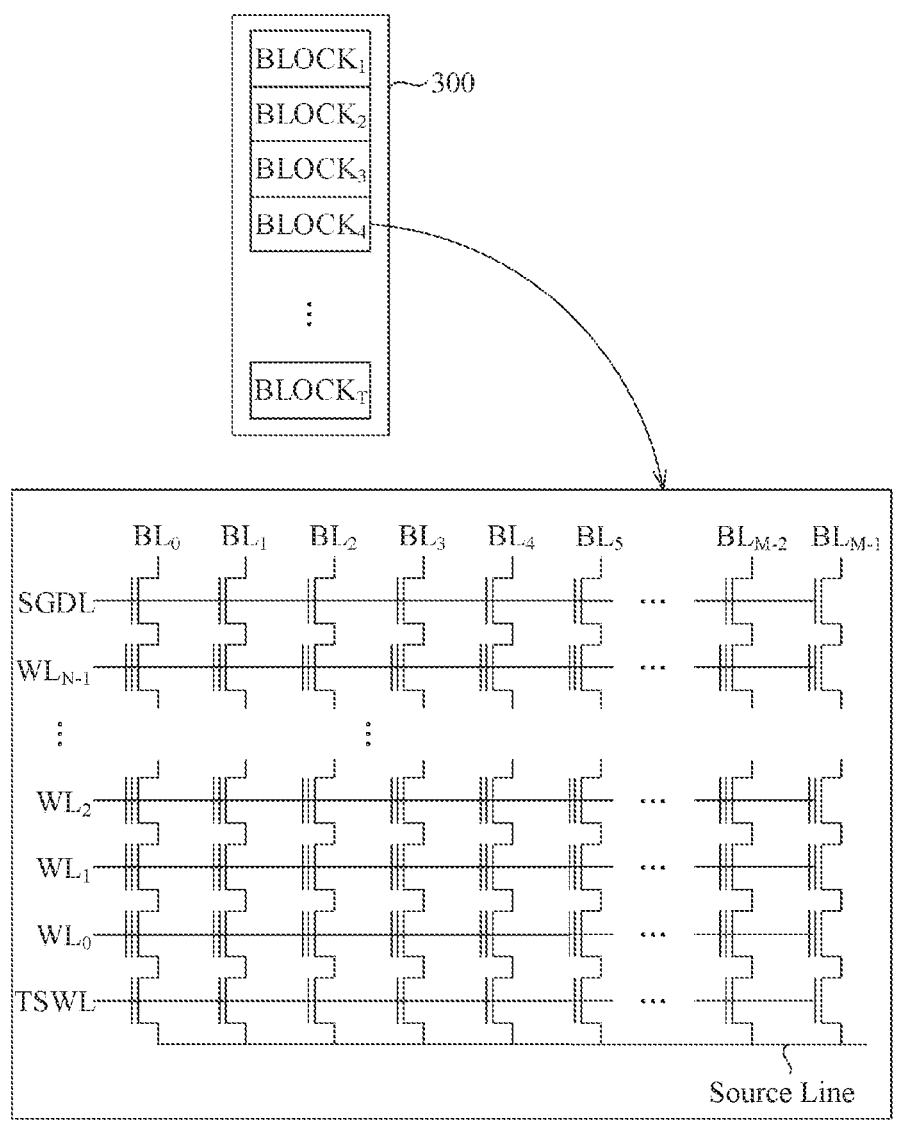
FIG. 3 is a structure diagram of a memory cell array provided in an embodiment of the present disclosure.

In a practical application process, the memory array in the memory is one with a plurality of memory blocks formed by reasonably arranging NAND strings shown in FIGS. 1 and 2, with an example structure as shown in FIG. 3. The memory array 300 is divided into $BLOCK_1$-$BLOCK_T$, a memory array with a plurality of memory blocks, where T is an integer and generically a large number. Each memory block contains a set of NAND strings that are accessed via bit lines $BL_0$-$BL_{M-1}$ and a set of common word lines $WL_0$-$WL_{N-1}$, where M and N are both integers greater than 1. One terminal of the NAND string is connected to a corresponding bit line through a top select gate SGD (controlled by a top select gate line SGDL), and another terminal is connected to a source line through a bottom select gate SGS (controlled by a bottom select gate line SGSL). In some embodiments, a memory block is a conventional erase unit. In some embodiments, a memory block may be logically divided into a plurality of pages, which is a conventional programming and reading unit. In some other embodiments, other erasing and programming units may also be used. In an example, the physical structure of the memory cell in the memory array shown in FIG. 3 does not limit the scope of the present disclosure.

Figure 4:
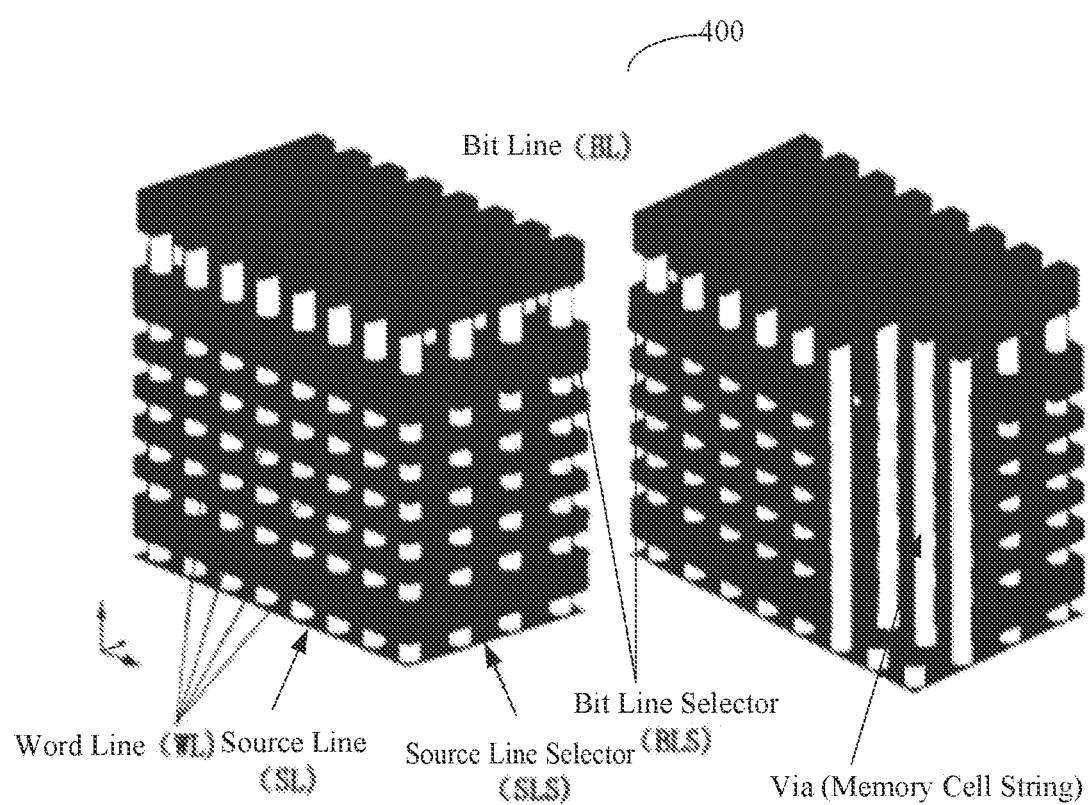
FIG. 4 is a structure diagram of a single block three-dimensional memory array provided in an embodiment of the present disclosure.

With regard to the structure of a certain memory block, as shown in FIG. 4, it shows a structure diagram of a three-dimensional memory array of a single memory block as provided in an embodiment of the present disclosure. With reference to FIG. 4, the memory block 400 contains a plurality of layers stacked on the substrate (not shown) and parallel to the surface of the substrate. FIG. 4 shows four word lines (WL) on four layers denoted as WL0 to WL3. The memory block 400 is further provided with a plurality of vias perpendicular to the word lines. A memory cell is formed at the intersection between a word line and a via, and therefore a via may be referred to as a memory cell string. It will be understood by one skilled in the art that, the number of word lines and the number of memory cell strings in memory block 400 are not limited to specific values. For example, the memory block 400 may include 64 word lines that intersect with a memory cell string, forming 64 memory cells along the memory cell string. As another example, the number of memory cell strings included in a memory block 400 can be in the order of hundreds of thousands, millions, or even larger, and one word line includes millions of memory cells formed by intersecting with millions of memory cell strings. The memory cells in memory block 400 may be single-level memory cells or multi-level memory cells, where the single-level memory cell may be a single-level cell (SLC) capable of storing 1 bit; and the multi-level memory cell may be a multi-level cell (MLC) capable of storing 2 bits, a tri-level cell (TLC) capable of storing 3 bits, a quad-level cell (QTC) capable of storing 4 bits or a penta-level cell (PLC) capable of storing 5 bits. As shown in FIG. 4, the memory block 400 further includes bit lines (BL), bit line selectors (BLS, also known as a top select gate line SGDL), source lines (SL), and source select lines (SLS, also known as a bottom select gate line SGSL), which, together with the word lines (WL), may address any memory cell in the memory block 400.

Figure 5A:
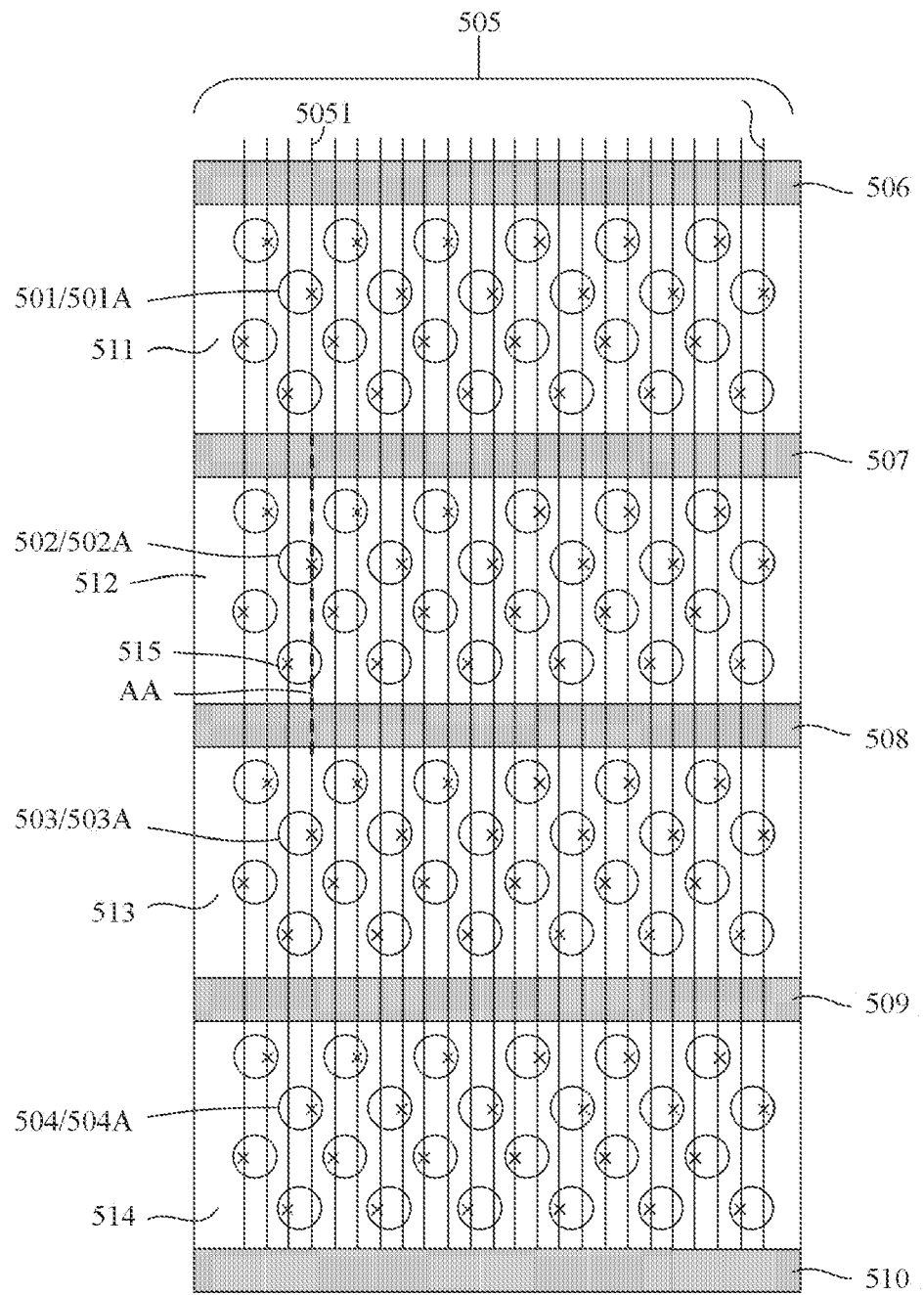
FIGS. 5(A) to 5(E) are relevant structure diagrams of three-dimensional NAND provided in embodiments of the present disclosure.

FIGS. 5(A) to 5(E) depict a structure diagram, a sectional view, etc., corresponding to a part of the three-dimensional (3D) NAND structure in FIG. 4. FIG. 5(A) is a structure diagram depicting a part of the 3D NAND structure in FIG. 4 as provided in an embodiment of the present disclosure. It is to be noted that the plurality of circles in FIG. 5(A) represent vertical columns, each including a plurality of select transistors (also known as select gates or selecting gates) and a plurality of memory cells. In one implementation, each vertical column implements a NAND string. For example, FIG. 5(A) depicts vertical columns 501, 502, 503, and 504, where the vertical column 501 implements a NAND string 501A. The vertical column 502 implements a NAND string 502A. The vertical column 503 implements a NAND string 503A. The vertical column 503 implements a NAND string 503A. It should be understood that FIG. 5(A) only shows a part of the top view of memory block 400, and therefore memory block 400 should have more vertical columns than those shown in FIG. 5(A). FIG. 5(A) further shows a set of bit lines 505. FIG. 5(A) only shows 24 bit lines since it only shows a part of the memory block 400. It should be understood that there should be more than 24 bit lines connected to the vertical column of the memory block 400. Each of the circles that represent vertical columns has an "x" to indicate that it is connected with a bit line. For example, bit line 5051 is connected to vertical columns 501, 502, 503, and 504. The memory block depicted in FIG. 5(A) further includes a set of local interconnects 506, 507, 508, 509, and 510 that connect layers to the source line below the vertical column. Local interconnects 506, 507, 508, 509, and 510 are further configured to divide each layer of the memory block 400 into four regions. For example, the top layer shown in FIG. 5(A) is divided into regions 511, 512, 513, and 514, which are referred to as fingers. In layers of the memory block that implements memory cells, these four regions are referred to as word line fingers that are separated by local interconnects. In one implementation, word line fingers on the common level of the memory block are connected with each other to form a single word line. In another implementation, word line fingers on the same level are not connected with each other. In one example implementation, the bit line is connected to only one vertical column in each of the regions 511, 512, 513, and 514. In this implementation, each memory block has 16 active columns and each bit line is connected to four rows in each memory block. In one implementation, all the four rows connected to the common bit line are connected to the same word line (via different word line fingers connected together on the same level); therefore, the memory system uses source select lines and drain select lines to select one (or another subset) of four rows that is to be subject to memory operations (programming, verification, reading and/or erasing).

It is to be noted that although FIG. 5(A) shows that each region in one memory block has four vertical columns and four regions have 16 rows of vertical columns, these specific numbers are example implementations. In other implementations, each block may include more or fewer regions, each region may include more or fewer rows of vertical columns, and each block may include more or fewer rows of vertical columns. Furthermore, FIG. 5(A) further shows that vertical columns are staggered. In other implementations, different stagger patterns may be used. In some implementations, vertical columns are not staggered.

Figure 5B:
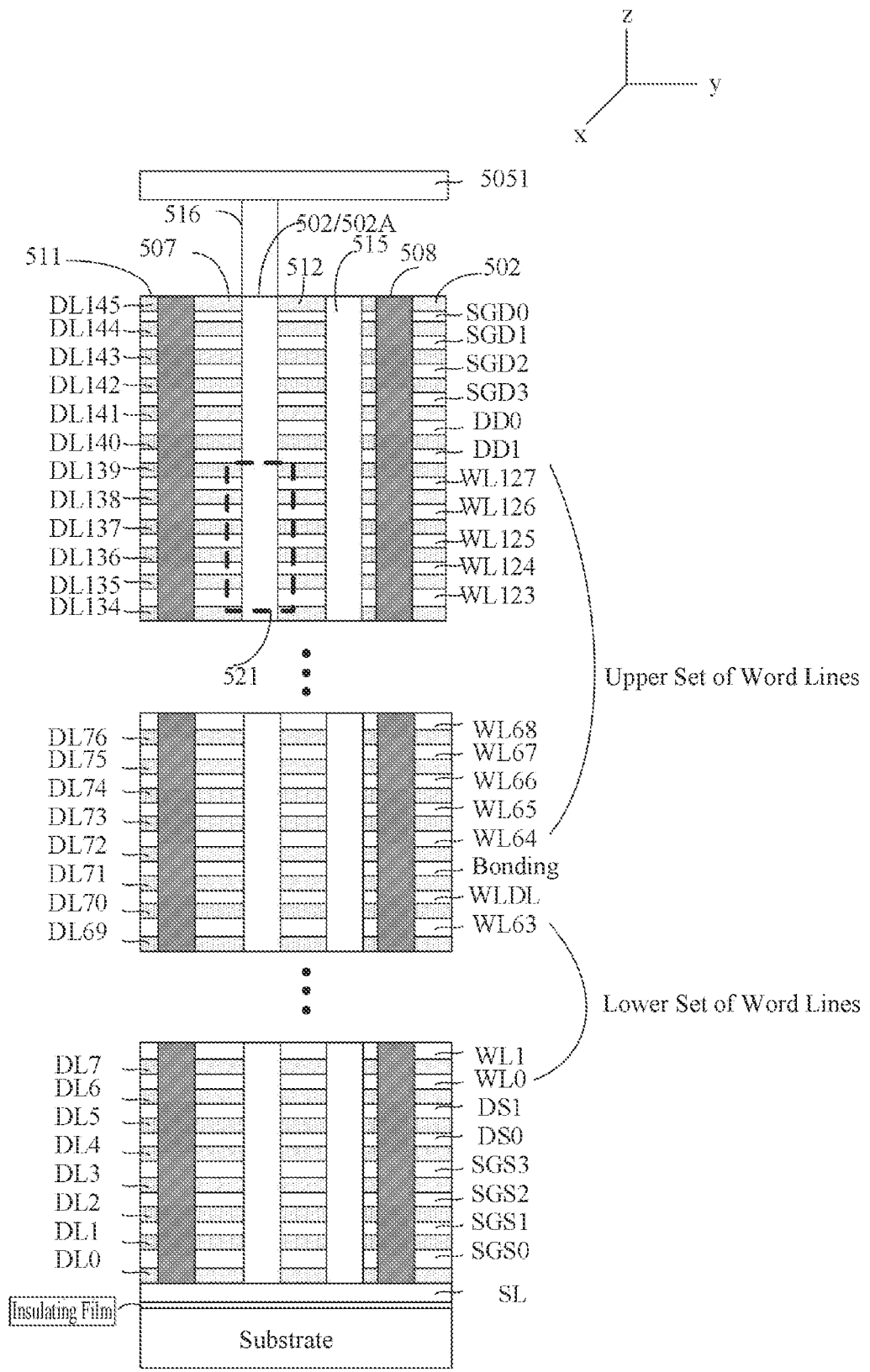

FIG. 5(B) shows a sectional view along line AA in FIG. 5(A). The sectional view cuts through vertical column 502 and the regions 515 and 512 adjacent to vertical column 502 (referring specifically to FIG. 5(A)). The memory block 400 shown in FIG. 5(B) includes: four drain side select layers SGD0, SGD1, SGD2, and SGD3; four source side select layers SGS0, SGS1, SGS2, and SGS3; six dummy word line layers TSWL0, TSWL1, BDWL0, BDWL1, WLDL, WLDU; and 128 data word line layers WLL0 to WLL127 configured to be connected to data memory cells. In other implementations, it is possible to implement more or less than four drain side select layers, more or less than four source side select layers, more or less than six dummy word line layers and more or less than 128 word line layers. Vertical columns 502 and 515 are depicted as protruding through drain side select layers, source side select layers, dummy word line layers, and word line layers. In one implementation, each vertical column includes a vertical NAND string. For example, the vertical column 502 includes NAND string 502A. Below the vertical column and the layers listed below are substrate 101 and an insulating film and source lines SL disposed thereon. The NAND string of vertical column 502 has a source end at the bottom of the stack and a drain end at the top. Consistent with FIG. 5(E), FIG. 5(B) shows a vertical column 502 connected to bit line 5051 via connector 516. Local interconnects 507 and 508 are also shown.

To facilitate references, drain side select layers SGD0, SGD1, SGD2, and SGD3; source side select layers SGS0, SGS1, SGS2, and SGS3; dummy word line layer TSWL0, TSWL1, BDWL0, BDWL1, WLDL, WLDU; and word line layers WLL0 to WLL127 are collectively referred to as conductive layers. In one implementation, the conductive layer may be made of a combination of TiN and Tungsten. In other implementations, other materials may also be used to form conductive layers, such as doped polysilicon and metal (such as Tungsten or metal silicides). In some implementations, different conductive layers may be formed of different materials. In between conductive layers are dielectric layers DL0 to DL145. For example, dielectric layer DL104 is over the word line layer WL94 and below the word line layer WL95. In one implementation, the dielectric layer may be made of $SiO_2$. In other implementations, the dielectric layer may be formed with other dielectric materials.

Herein, the non-volatile memory cells are formed along the vertical column extending through alternating conductive layers and dielectric layers in the stack. In one implementation, the memory cells are arranged in the NAND string. Word line layers WL0 to WL127 are connected to memory cells (in other words, word line layers WL0 to WL127 are coupled to memory cells that may also be referred to as data memory cells). Dummy word line layers TSWL0, TSWL1, BDWL0, BDWL1, WLDL, and WLDU are connected to dummy memory cells. Dummy memory cells do not store host data and are not qualified to store host data (data provided from a host, such as data from host users), while data memory cells are qualified to store host data. In some implementations, data memory cells and dummy memory cells may have the same structure. Dummy word lines are connected to dummy memory cells. Drain side select layers SGD0, SGD1, SGD2, and SGD3 are used to electrically connect/disconnect the NAND string to/from the bit line. Source side select layers SGS0, SGS1, SGS2, and SGS3 are used to electrically connect/disconnect the NAND string to/from the source line SL.

FIG. 5(B) also shows a bonding area. In one implementation, etching 128 word line layers blending with the dielectric layers is expensive and/or challenging. In order to relieve the burden, one implementation includes disposing a first stack of 64 word line layers alternating with the dielectric layers, disposing a bonding area and disposing a second stack of 64 word line layers alternating with the dielectric layers. The bonding area is located between the first stack and the second stack. The bonding area is configured to bond the first stack to the second stack. In FIG. 5(B), the first stack may be denoted as the lower set of word lines; and the second stack may be denoted as the upper set of word lines. In one implementation, the bonding area may be made of the same material as the word line layer. In one example implementation, the plurality of word lines (control lines) may include a first stack of alternating word line layers and dielectric layers, a second stack of alternating word lines and dielectric layers, and a bonding area between the first stack and the second stack, as shown in FIG. 5(B).

Figure 5C:
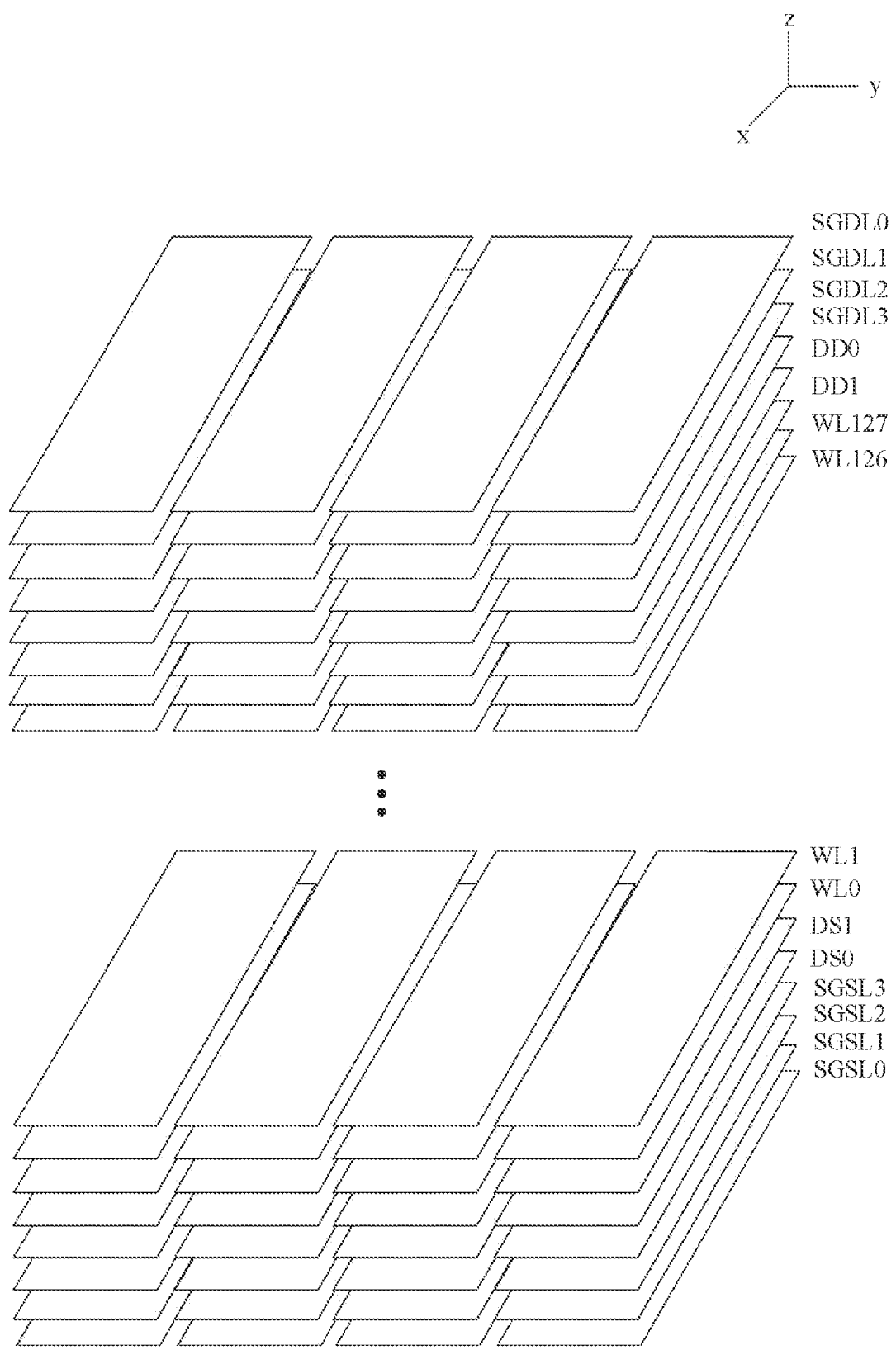

FIG. 5(C) depicts a logical representation of conductive layers of partial memory blocks in FIG. 5(B), e.g., a logical representation of SGD0, SGD1, SGD2, SGD3, SGS0, SGS1, SGS2, SGS3, TSWL0, TSWL1, BDWL0, BDWL1, and word lines WL0 to WL127. According to the above description of FIG. 5(A), in one implementation, local interconnects 506, 507, 508, 509, and 510 divide a conductive layer into four regions/fingers (or memory sub-block). For example, word line layer WL126 is divided into regions 517, 518, 519, and 520. In case of word line layers WL0 to WL95, the regions are referred to as word line fingers. Therefore, word line layer WL94 is divided by local interconnects 506, 507, 508, 509, and 510 into word line fingers 517, 518, 519, and 520. In a practical application process, region 517 is one word line finger on one word line layer. In one implementation, four word line fingers on the same level are connected with each other. In another implementation, each word line finger operates as a separate word line. The drain side select gate layer SGD0 (top layer) is also divided into regions 511, 512, 513, and 514, which are also known as fingers or select line fingers. In one implementation, four select line fingers on the same level are connected with each other. In another implementation, each select line finger operates as a separate word line.

Figure 5D:
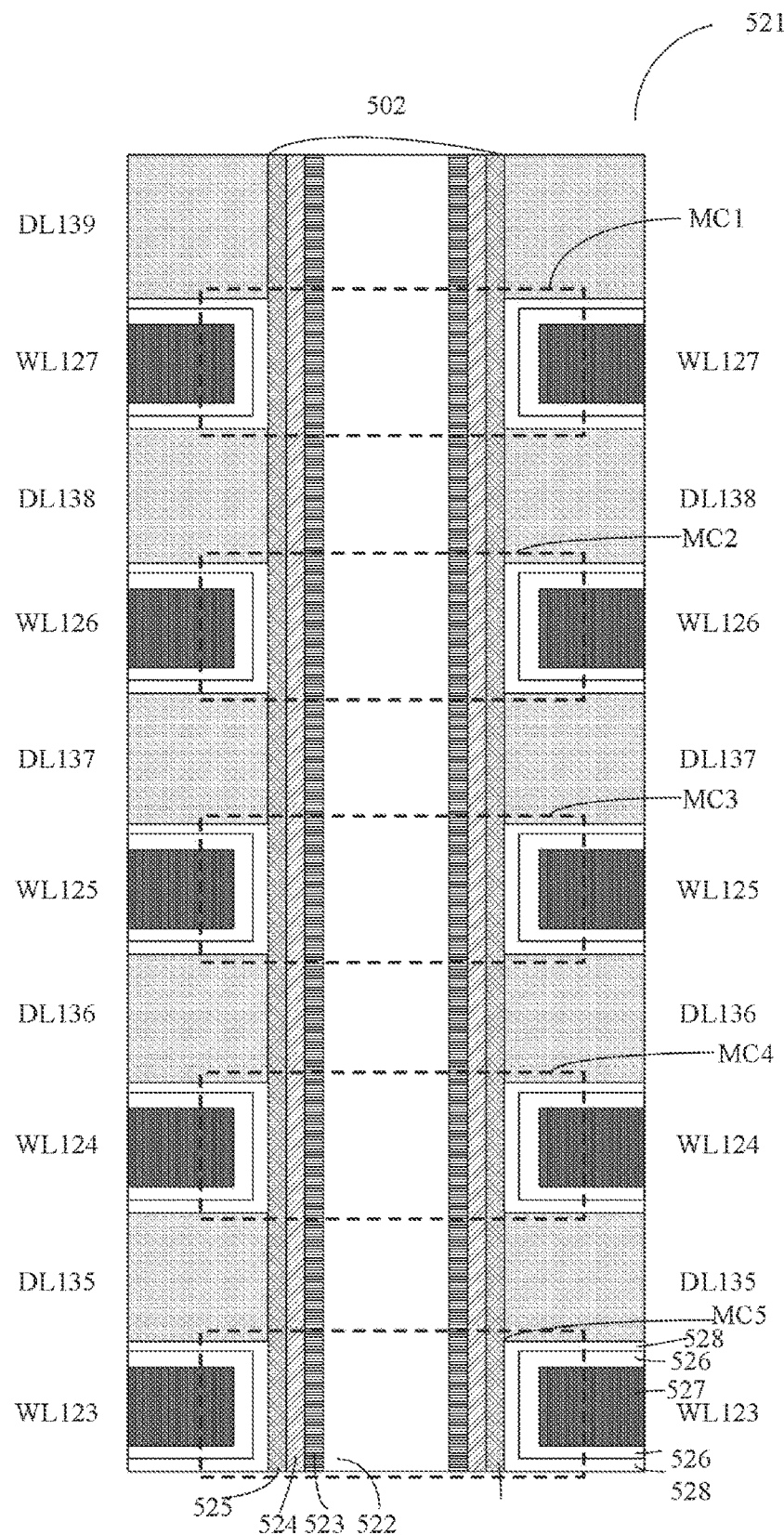
Figure 5E:
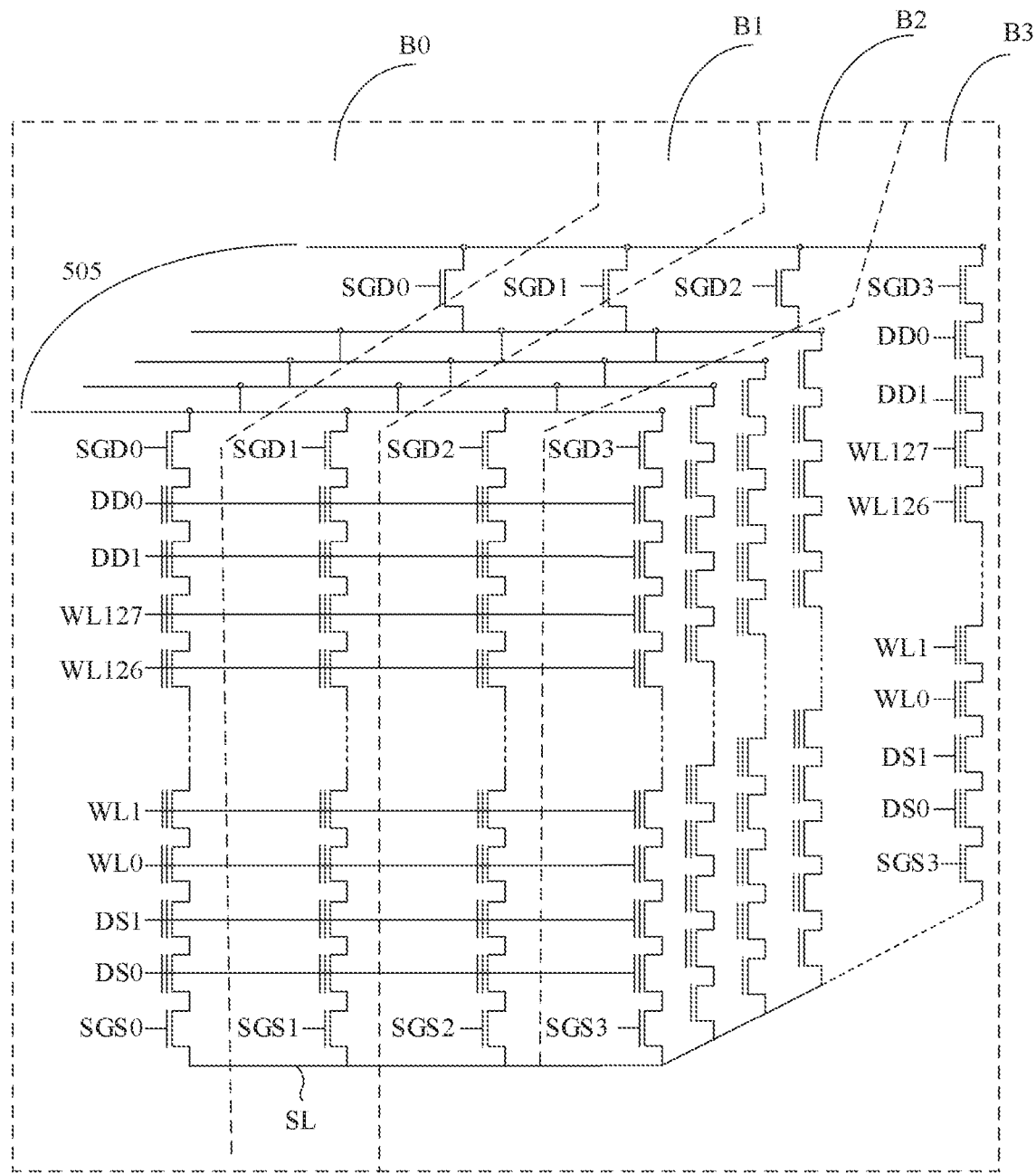

FIG. 5(D) depicts a sectional view of region 521 in FIG. 5(B), including a part of the vertical column 502 (memory hole). In one implementation, the vertical column is circular; however, in other implementations, it may assume other shapes. In one implementation, vertical column 502 may include an inner core layer 522 made of dielectric such as SiO$_2$. Other materials may also be used. A polysilicon channel 523 encloses the inner core layer 522. Materials other than polysilicon may also be used. It should be noted that channel 523 is connected to bit lines and source lines. A tunneling dielectric 524 encloses channel 523. In one implementation, the tunneling dielectric 524 has an ONO structure. A charge trap layer 525 such as silicon nitride encloses the tunneling dielectric 524. Other memory materials and structures may also be used. The technology described herein is not limited to any particular material or structure.

FIG. 5(D) depicts dielectric layers DL139, DL138, DL137, DL136, and DL135 and word lines WL127, WL126, WL125, WL124, and WL123. Each of the word line layers includes a word line region 527 enclosed by an aluminum oxide layer 526, which is enclosed by a barrier oxide layer 528. The word line layer and the vertical column form memory cells through physical interaction. Accordingly, in one implementation, a memory cell includes a channel 523, a tunneling dielectric 524, a charge trap layer 525, a barrier oxide layer 528, an aluminum oxide layer 526, and a word line region 527. For example, word line layer WL127 and a part of vertical column 502 constitute a memory cell MC1. Word line layer WL126 and a part of vertical column 502 constitute a memory cell MC2. Word line layer WL125 and a part of vertical column 502 constitute a memory cell MC3. Word line layer WL124 and a part of vertical column 502 constitute a memory cell MC4. Word line layer WL123 and a part of vertical column 502 constitute a memory cell MC5. In other architecture, the memory cell may have a different structure; however, the memory cell is still a data memory cell.

While programming a memory cell, electrons are stored in a part of the charge trap layer 525 that is associated with the memory cell. In response to a proper voltage on the word line region 527, these electrons are attracted into the charge trap layer 525 from the channel 523 through the tunneling dielectric 524. The threshold voltage ($V_{th}$) of a memory cell increases in proportion to the amount of stored charge. In one implementation, programming is implemented by the electrons' Fowler-Nordheim tunneling to the charge trap layer. In the erase operation, electrons return to the channel, or holes are injected into the charge trap layer to recombine with electrons. In one implementation, erasing is implemented by injecting holes into the charge trap layer through a physical mechanism such as gate induced drain leak (GIDL).

FIG. 5(E) is a diagram of a part of the memory shown in FIGS. 4 to 5(D). FIG. 5(E) shows physical word lines WL0 to WL 127 extending across the block. The structure of FIG. 5(E) corresponds to a part of the memory block 400 in FIG. 5(A) to FIG. 5(D), including bit line 505. In the memory block, each bit line is connected to four NAND strings. Drain side select lines SGD0, SGD1, SGD2 and SGD3 are used to determine which of the four NAND strings is to be connected to the associated one or more bit lines. Source side select lines SGS0, SGS1, SGS2 and SGS3 are used to determine which of the four NAND strings is to be connected to the common source line. It is also possible to contemplate dividing the block into four memory sub-blocks B0, B1, B2, and B3. The memory sub-block B0 corresponds to the vertical NAND string controlled by SGD0 and SGS0, the memory sub-block B1 corresponds to the vertical NAND string controlled by SGD1 and SGS1, the memory sub-block B2 corresponds to the vertical NAND string controlled by SGD2 and SGS2, and the memory sub-block B3 corresponds to the vertical NAND string controlled by SGD3 and SGS3.

It is to be noted that the example memory system in FIGS. 4 to 5(E) is of a three-dimensional memory structure including vertical NAND strings having charge trapping material, however other (2D and 3D) memory structures may also be used with the technology described herein.

Figure 6:
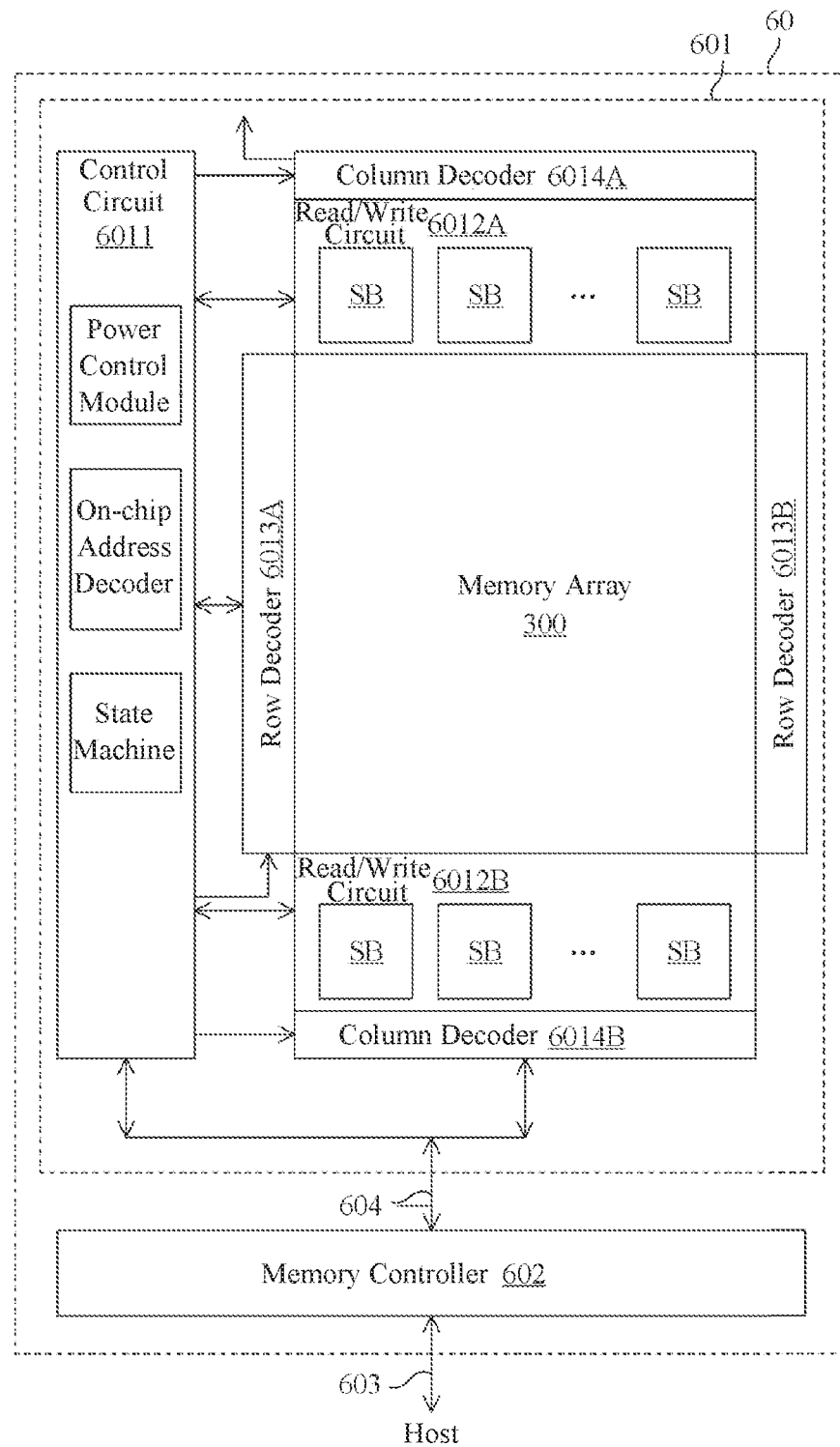
FIG. 6 is a structure diagram of a memory having a read/write circuit for parallel reading and programming the memory cell array provided in an embodiment of the present disclosure.

Based on the memory array shown in FIG. 3, FIG. 6 shows a structure diagram of a memory system 60 provided in an embodiment of the present disclosure, which is formed based on the memory array shown in FIG. 3 and includes read/write circuits for reading and/or programming pages (or other units) of a memory array in parallel.

The memory system 60 includes a memory 601 and a memory controller 602, where the memory 601 includes a memory array 300 (two-dimensional or three-dimensional) and a peripheral circuit including a control circuit 6011, read/write circuits 6012A and 6012B, row decoders 6013A and 6013B and column decoders 6014A and 6014B. In some embodiments, access to the memory array 300 by various peripheral circuits is implemented in a symmetrical manner on opposite sides of the memory array 300 so as to reduce access and circuit density on either side by half. The read/write circuits 6012A and 6012B include a plurality of sense blocks SB configured to read or program pages of the memory array 300 in parallel. The memory array 300 may be addressed via row decoders 6013A and 6013B through word lines and via column decoders 6014A and 6014B through bit lines. In some embodiments, the memory array 300, the control circuit 6011, the read/write circuits 6012A and 6012B, the row decoders 6013A and 6013B, and the column decoders 6014A and 6014B may be manufactured on a chip, where the dashed line block in FIG. 6 may also represent the chip. External signals and data are transferred between the host and the memory controller 602 via the signal line 603 and between the memory controller 602 and the chip via the signal line 604.

The control circuit 6011 is configured to cooperate with the read/write circuits 6012A and 6012B to implement memory operations on the memory array 300. The control circuit 6011 includes a state machine, an on-chip address decoder, and a power control module, where the state machine is configured to provide chip-level control over the memory operations; the on-chip address decoder is configured to provide an address interface between the addresses used by the controller of the host or memory system and the hardware addresses used by the row decoders 6013A and 6013B and column decoders 6014A and 6014B. The power control module is configured to control the power and voltage provided to word lines and bit lines for each memory operation.

The memory array in the above-described memory system may be erased, programmed, and read. Upon the end of the successful programming process (with verification), at a proper time, the threshold voltage of the programmed memory cell should be within one or more distributions for the threshold voltage of the programmed memory cell or within the distribution for the threshold voltage of the erased memory cell.

Figure 7:
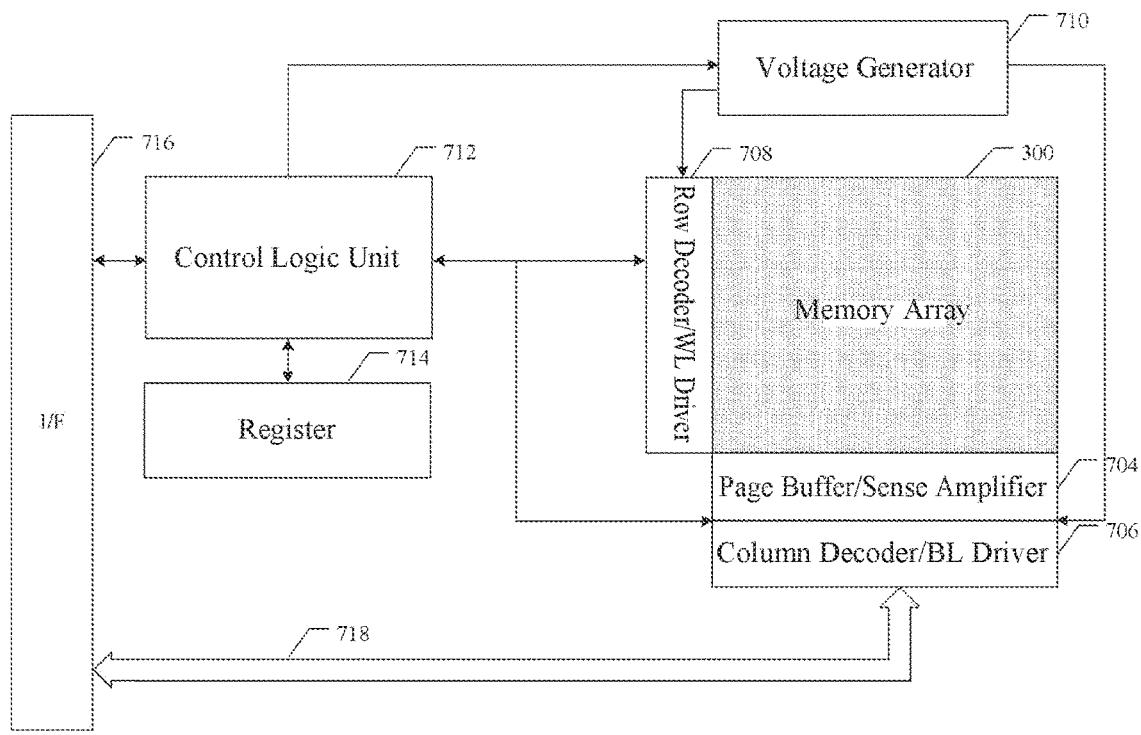
FIG. 7 is a structure diagram between a peripheral circuit and the memory array provided in an embodiment of the present disclosure.

Although the relationship between the peripheral circuit and the memory array 300 has been described in detail above, in some other implementations, the peripheral circuit and the memory array may also be shown in the structure of FIG. 7 below. FIG. 7 shows a block diagram of example memory including a memory array and peripheral circuits according to some aspects of the present disclosure.

FIG. 7 shows some example peripheral circuits including a page buffer 704, a column decoder 706, a row decoder 708, a voltage generator 710, a control logic unit 712, a register 714, and an input/output (I/O) circuit 716. It should be understood that in some examples, additional peripheral circuits not shown in FIG. 7 may be further included.

The page buffer 704 may be connected to the memory cell array 300 via bit lines and configured to read data from the memory array 300 and program (write) data to the memory array 300 according to the control signals from the control logic unit 712. In one example, the page buffer 704 may store a page of programming data (writing data) to be programmed into a memory page of the memory array 300. In another example, the page buffer 704 may sense signals from the bit line to verify that the data has been properly programmed into the target memory cells coupled to the selected word line 718. In yet another example, in a read operation, the page buffer 704 may further sense low-power signals representing data bits stored in the memory cells from the bit line and amplify the small voltage swing to a discernible logic level. The column decoder 706 may be configured to be controlled by the control logic unit 712 and select one or more NAND memory strings by applying a bit line voltage generated by the voltage generator 710.

The row decoder 708 may be connected to the memory array 300 via a word line and may select a word line based on a row address. The row decoder 708 may be configured to be controlled by the control logic unit 712 according to control signals and select/deselect memory blocks of the memory array 300 and select/deselect selected rows of the memory block. The row decoder 708 may be further configured to provide the word line voltage generated by the voltage generator 710 to the word line. In some implementations, the row decoder 708 may further provide the SSG voltage and the DSG voltage generated by the voltage generator 710 to the drive SSG line 315 and the DSG line 313.

The voltage generator 710 may be configured to be controlled by the control logic unit 712 and generate various voltages provided to the memory array 300, such as the word line voltage (for example, read voltage, program voltage, pass voltage, verification voltage), the SSG voltage (select/deselect voltage), the DSG voltage (select/deselect voltage), the bit line voltage and the source line voltage, etc.

The control logic unit 712 may be coupled to each peripheral circuit described above and configured to control the operations of respective peripheral circuits. The register 714 may be coupled to the control logic unit 712 and include a status register, a command register, and an address register for storing status information, command opcodes, and command addresses for controlling operations of each peripheral circuit. The control logic unit 712 may be implemented by a microprocessor, a microcontroller (also known as a microcontroller unit (MCU)), a digital signal processor (DSP), an application-specific integrated circuit (ASIC), a field programmable gate array (FPGA), a programmable logic device (PLD), a state machine, a gated logic unit, a discrete hardware circuitry or combinations thereof, and other suitable hardware, firmware, and/or software configured to carry out various functions described below.

The input/output circuit 716 may be coupled to the control logic unit 712, and serve as a control buffer to buffer control commands received from the memory controller 602 and relay them to the control logic unit 712, and buffer status information received from the control logic unit 712 and relay them to the memory controller. The input/output circuit 716 may be further coupled to the column decoder 706 and serve as a data input/output interface and a data buffer to buffer data and relay it to the memory array 300 or relay or buffer data from the memory array 300.

It is to be noted that FIGS. 6 and 7 describe the peripheral circuits and the memory array from different viewpoints, where the control circuit in FIG. 6 and the control logic unit in FIG. 7 are only different names under different viewpoints, they are the same in function. They may be understood as the same structure.

Figure 8:
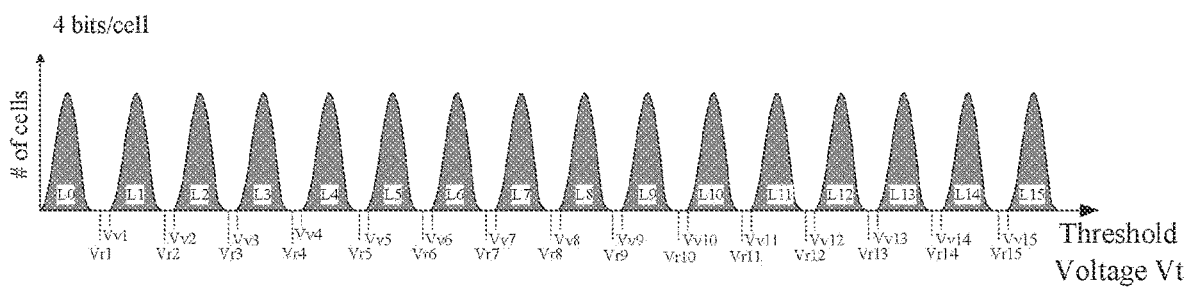
FIG. 8 is a graph of the threshold voltage vs. the number of memory cells as provided in an embodiment of the present disclosure.

FIG. 8 is a graph of threshold voltage vs. the number of memory cells and illustrates an exemplary threshold voltage distribution of the memory array while each memory cell stores four bits of data. However, in other implementations, it is possible to use other data capacity for each memory cell, such as the above-mentioned SLC storing 1 bit of data, MLC storing 2 bits of data, TLC storing 3 bits of data, and PLC storing 5 bits of data, etc. A memory cell storing more than one bit of data is referred to as a multi-level cell, MLC. FIG. 8 shows 16 threshold voltage distributions corresponding to 16 threshold voltage distributions: E (also known as L0), L1, L2, L3, L4, L5, L6, L7, L8, L9, L10, L11, L12, L13, L14, L15, with the threshold voltages increasing successively. Likewise, the threshold voltage distribution E corresponds to the erase data status; the threshold voltage distributions L1, L2, L3, L4, L5, L6, L7, L8, L9, L10, L11, L12, L13, L14, and L15 correspond to programming data status. For data status N, the data status N has a threshold voltage higher than data status N−1 and lower than data status N+1. In some embodiments, a memory cell of a quad-level cell (QLC) type stores four bits of data. Specifically, an erased memory cell may store data 1111, and a memory cell programmed to data status L1, L2, L3, L4, L5, L6, L7, L8, L9, L10, L11, L12, L13, L14, and L15 may store data 1110, 1101, 1100, 1011, 1010, 1201, 1000, 0111, 0110, 0101, 0100, 0011, 0010, 0001, 0000, respectively. For data status N, the data status N has a threshold voltage higher than data status N−1 and lower than data status N+1. The first threshold voltage distribution corresponds to data status L0, representing an erased memory cell. Other 15 threshold voltage distributions correspond to data status L1 to L15 representing programmed memory cells and therefore are also known as programming data status. In some implementations, data status L1-L15 may overlap, where the memory controller 602 relies on error correction to identify the correct data being stored. FIG. 7 also shows 15 reading reference voltages Vr1, Vr2, Vr3, Vr4, Vr5, Vr6, Vr7, Vr8, Vr9, Vr10, Vr11, Vr12, Vr13, Vr14, and Vr15 for reading data from memory cells. The specific reading process may be testing (for example, executing sense operation) whether the threshold voltage of a given memory cell is above or below the 15 reading reference voltages such that the memory system can determine the data status that the memory cell is in.

FIG. 8 also shows 15 verification reference voltages Vv1, Vv2, Vv3, Vv4, Vv5, Vv6, Vv7, Vv8, Vv9, Vv10, Vv11, Vv12, Vv13, Vv14, and Vv15, also known as verification target voltages. While memory cells are programmed to data status L1, the memory system will test whether these memory cells have a threshold voltage greater than or equal to Vv1. While memory cells are programmed to data status L2, the memory system will test whether the memory cells have a threshold voltage greater than or equal to Vv2. While memory cells are programmed to data status L3, the memory system will determine whether the memory cells have a threshold voltage greater than or equal to Vv3. While memory cells are programmed to data status L4, the system will test whether these memory cells have a threshold voltage greater than or equal to Vv4. While memory cells are programmed to data status L5, the memory system will test whether these memory cells have a threshold voltage greater than or equal to Vv5. While memory cells are programmed to data status L6, the memory system will test whether these memory cells have a threshold voltage greater than or equal to Vv6. While memory cells are programmed to data status L7, the memory system will test whether these memory cells have a threshold voltage greater than or equal to Vv7. For other data statuses, it is verified successively whether they have threshold voltages greater than or equal to Vv8, Vv9, Vv10, Vv11, Vv12, Vv13, Vv14, and Vv15 to determine whether they are programmed to L8, L9, L10, L11, L12, L13, L14, and L15. In one implementation known as full sequence programming, a memory cell may be programmed from erasing data status L0 directly to any one of the programming data statuses L1-S15. For example, it is possible to first erase the set of memory cells to be programmed such that all memory cells in the set are in erase data status L0. Then, the memory cell is programmed with a programming process directly to one of the data statuses L1, L2, L3, L4, L5, L6, L7, L8, L9, L10, L11, L12, L13, L14, and L15. For example, while some memory cells are being programmed from data status L0 to data status L1, other memory cells are being programmed from data status L0 to data status L2 and/or from data status L0 to data status L3, and so on. The arrow in FIG. 8 indicates the full sequence programming. Other than full sequence programming, the technology described herein may also be applied to other types of programming, including, but not limited to multi-level programming/multi-phase programming.

Each threshold voltage distribution (data status) in FIG. 8 corresponds to predetermined values of a set of data bits stored in the memory cells. The specific relationship between the data programmed into a memory cell and the threshold voltage level of the memory cell depends on the data coding scheme employed by the memory cell. In one implementation, data values are assigned into the threshold voltage range with Gray code assignment such that only one bit will be affected if the threshold voltage of the memory incorrectly shifts to its neighboring physical state.

Generally, during the verification operation and the read operation, a selected word line is connected to a voltage that is the reference voltage having a level specified for each read operation (for example, see the read reference voltage in FIG. 8) or verification operation (for example, see the verification reference voltage in FIG. 8), so as to determine whether the threshold voltage of the related memory cell has reached this level. After applying the voltage to the word line, the conduction current of the memory cell is measured to determine whether the memory cell turns on in response to the voltage applied to the word line (whether there is any conduction current and measuring the magnitude of the conduction current). If the conduction current is measured to be greater than a specific value, then it is assumed that the memory cell is turned on and the voltage applied to the word line is greater than the threshold voltage of the memory cell. If the conduction current is not measured to be greater than a specific value, then it is assumed that the memory cell is not turned on and the voltage applied to the word line is not greater than the threshold voltage of the memory cell. During the reading or verification process, unselected memory cells are provided with one or more pass voltages (also known as bypass voltages) at their control gates such that these memory cells will operate as pass gates and these memory cells conduct currents no matter whether they are programmed or erased.

There are many methods for measuring conduction currents of memory cells during reading or verification operations. In one example, the conduction current of the memory cell is measured in terms of the rate at which the memory cell charges or discharges the dedicated capacitor in the sense amplifier. In another example, the conduction current of the selected memory cell allows (or disallows) the NAND string including the memory cell to discharge the corresponding bit line, and the voltage on the bit line is measured after a period of time to check whether it is discharged. It is noted that the technology described herein may be applied with different known methods in the art for verifying/reading. Other reading and verifying technologies known in the art may also be applied.

Figure 9:
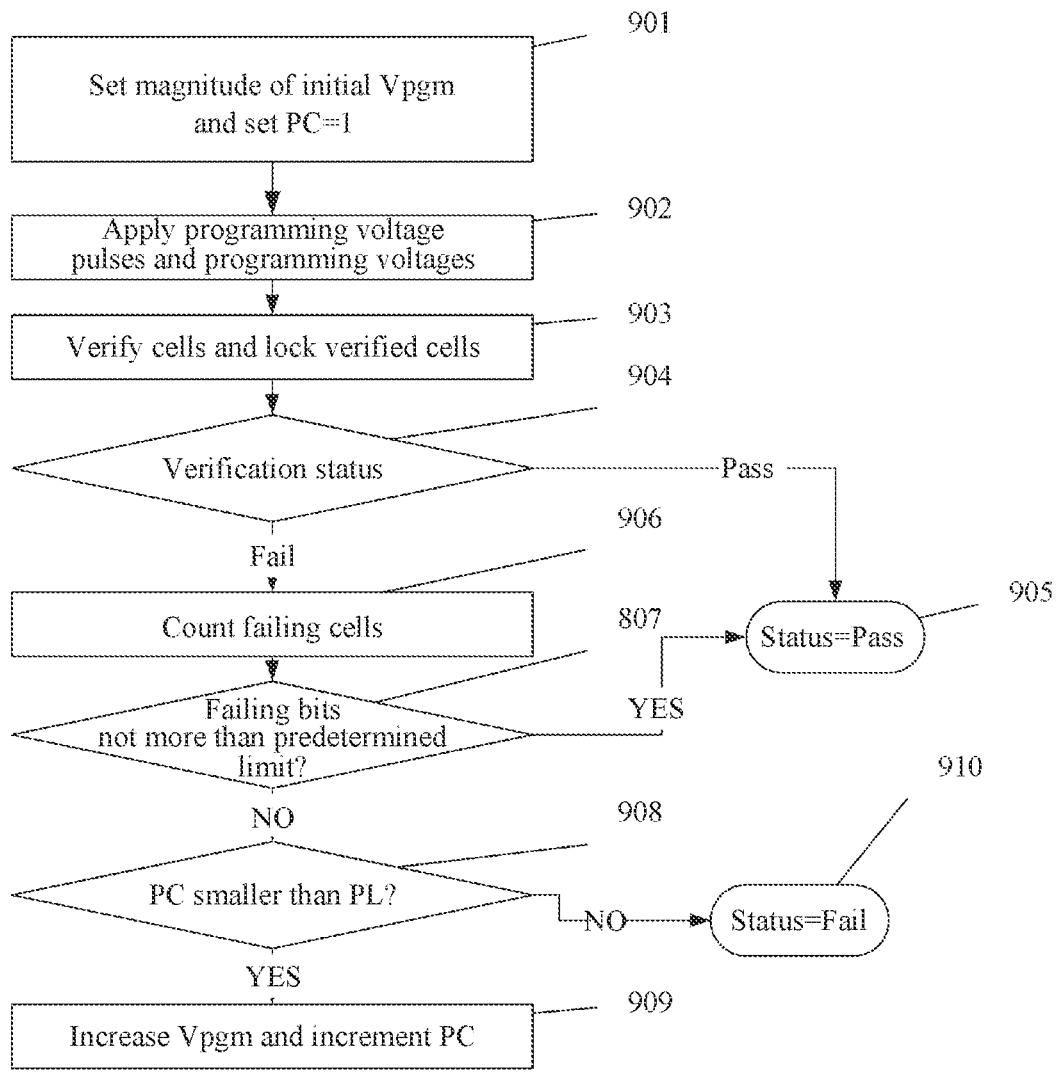
FIG. 9 is a flow chart of programming provided in an embodiment of the present disclosure.

FIG. 9 is a flow chart showing an implementation of a programming process executed by the memory 601. In one example implementation, the process shown in FIG. 9 is carried out on the memory 601 with the above-discussed control circuit under the direction of the state machine. The process of FIG. 9 is carried out to implement the full sequence programming of FIG. 8 or other coding schemes including multi-level programming. While implementing multi-level programming, the process of FIG. 9 is configured to implement any/every stage of the multi-level programming process.

Figure 10:
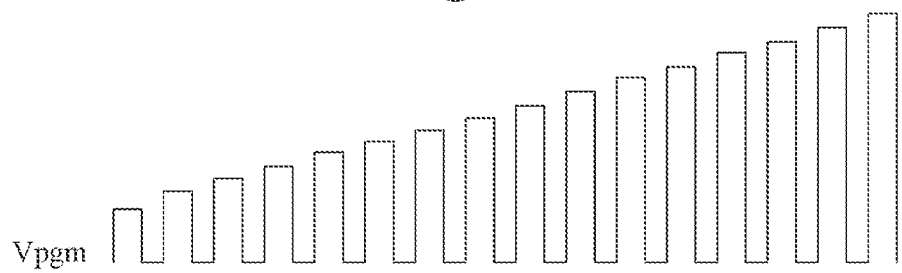
FIG. 10 is a structure diagram of programming pulses of an ISPP mode as provided in an embodiment of the present disclosure.

In general, during the programming operation, the programming signal Vpgm (also known as programming voltage, programming pulse) is applied to the control gate (via the selected word line) as a series of programming voltage pulses, as shown in FIG. 10. In between the programming pulses are a set of verification pulses to perform verification.

In some implementations, the magnitude of Vpgm increases by a predetermined step size with each successive pulse. For example, the predetermined step size may be selected in a range from 0.2V to 0.5V. In step 901 of FIG. 9, the programming voltage (Vpgm) is initialized to the start magnitude such as any level between about 12V to about 16V or another suitable level, and the programming counter PC maintained by the state machine is initialized to 1. In step 902, programming pulses of Vpgm are applied to the selected word line that is the word line selected for programming. In one implementation, a set of memory cells programmed at the same time are all connected to the same word line that is the selected word line. Unselected word lines receive one or more boosted voltages (alternatively known as pass voltages), such as about 7V to 11V, to implement the boosting scheme known in the art. In one implementation, if a memory cell should be programmed, the corresponding bit line is grounded. On the other hand, if the memory cell should maintain its current threshold voltage, the corresponding bit line is connected to Vdd, such as 1V to 3.5V, to suppress programming. In step 902, the programming voltage pulses are applied to all memory cells connected to the selected word line at the same time so as to program all memory cells connected to the selected word line at the same time. That is, they are programmed at the same time or in overlapping periods of time (both considered as simultaneous). In this way, unless they are locked to prevent programming, all memory cells connected to the selected word line will undergo variations of their threshold voltages at the same time.

In step 903, one or more verification operations are executed with a set of appropriate verification reference voltages to verify suitable memory cells. In one implementation, the verification process is executed by testing whether threshold voltages of memory cells selected for programming reach the verification reference voltage.

In step 904, it is determined whether all memory cells reach their target threshold voltages (pass). If so, the programming process is completed and successful, since all selected memory cells have been programmed and verified for their target status. In step 905, the "pass" (or success) status is reported. If in step 904, it is determined not all memory cells reach their target threshold voltages (fail), the programming process will proceed to step 906.

In step 906, the system counts the number of memory cells that have not yet reached their respective target threshold voltage distributions. That is, the system counts the number of memory cells that failed in the verification process till now. The counting may be implemented by the state machine, the memory controller 602, or other logic components. In one specific implementation, each of the sense blocks would store the status (pass/fail) of its corresponding memory cell. In one implementation, there is an overall count that reflects the total number of memory cells being programmed currently that failed in the last verification step. In another implementation, a separate count is maintained for each data status.

In step 907, it is determined whether the count from step 906 is less than or equal to a predetermined limit. In one implementation, the predetermined limit is the number of bits that may be corrected by error correction code (ECC) during the page reading process of the memory cells. If the number of failed cells is less than or equal to the predetermined limit, the programming process ends, and a "pass" status is reported in step 905. In this case, enough memory cells are programmed correctly such that the remaining several memory cells that have not been programmed completely may be corrected with ECC in the reading process. In some implementations, in step 906, the number of failed cells is counted for each sector, each target data status or other units, and in step 907, these counts are compared separately or together against one or more thresholds.

In one implementation, the predetermined limit may be less than the total number of bits that may be corrected by ECC during the page reading process to account for future errors. While programming less than all of the memory cells of a page or comparing the count of only one data status (or less than all statuses), the predetermined limit may be a portion (in or not in proportion) of the number of bits that may be corrected with ECC during the reading process of the page of memory cells. In some implementations, the limit is not predetermined. In contrast, it varies based on the number of errors in counting for the page, the number of programming-erasing cycles that have been executed or other standards.

If the number of failed memory cells is not less than the predetermined limit, the programming process proceeds at step 908, checking the programming counter PC against the programming limit (PL). For example, the programming limits include 6, 20 and 30, etc. However, other values may be used. If the programming counter PC is no less than the programming limit PL, it is considered that the programming process fails and a "fail" status is reported in step 910. If the programming counter PC is less than the programming limit PL, the process proceeds at step 909 where the programming counter PC increment by 1, and the programming voltage Vpgm is further stepped to the next magnitude. For example, the next pulse would have a magnitude one step size greater than the previous pulse. For example, the step size may be 0.1V to 0.4V. After step 909, the process cycles back to step 902, and another programming pulse is applied to the selected word line such that another iteration of the programming process of FIG. 9 is carried out (steps 902 to 909).

Since errors might occur during programming or reading and errors might occur during storing data (due to electron drift, data retention issues, or other phenomena), error correction is applied together with data programming. For memory systems, an error correction code (ECC) is often used to protect data from damaging. Many ECC codes are well known in the art. These conventional error correction codes are particularly useful in large capacity memories including flash memories (and other non-volatile memories), since such coding schemes may provide a substantial effect on manufacturing yields and device reliability such that devices having several non-programmable or defective units become available. Of course, there is a trade-off between the yield saving and the cost of providing additional memory cells to store code bits (namely, coding "rate"). Therefore, some ECC codes are more suitable for flash memory devices than others. Generally, ECC codes for flash memory devices tend to have a higher coding rate (i.e., lower code bits/data bit ratio) than codes used in data communication applications (which may have as low as ½ coding rate). Examples of well-known ECC codes generally used with flash memory storage devices include Reed-Solomon codes, other BCH codes, Hamming codes, etc. Sometimes, error correction codes used with flash memory storage devices are "systematic", since the data part of the final codeword and the encoded practical data do not change, where codes or parity check bits are appended to data bits to form complete codewords.

Specific parameters of a given error correction code include the type of code, the size of the practical data block from which the codeword is derived and the overall length of the codeword after coding. For example, if at least 60 ECC or parity check bits are used, a typical BCH code applied to 512-byte (4096-bit) data sector may correct up to four error bits. Reed-Solomon codes are a subset of BCH codes and are also often used to correct errors. For example, typical Reed-Solomon codes may use about 72 ECC bits to correct up to four errors in a 512-byte data sector. In the case of flash memories, error correction codes provide significant improvements to manufacturing yields and reliability over time of flash memories.

In some implementations, the memory controller 602 receives host data (also referred to as user data or data from an entity external to the memory system) to be stored in the nonvolatile memory, which is also referred to as information bits. Information bits are denoted by a matrix i=[1 0] (note that the two bits are only for illustrative purposes, many implementations have codewords longer than two bits). The error correction coding process (such as any processes mentioned in the context) is implemented by the ECC engine of the memory controller 602, where parity check bits are added to information bits to provide data represented by the matrix or codeword v=[1 0 1 0], indicating that two parity check bits have been added to the data bits. Other techniques for mapping the input data to the output data in a more complex manner may be used. For example, it is possible to use low-density parity check (LDPC) codes, also known as Gallager codes. In the implementation process, such LDPC codes are generally applied (e.g., by the ECC engine) to a plurality of pages encoded across multiple memory elements, but they need not be applied across multiple pages. It is possible to map data bits to a logic page and store them in the memory array by programming one or more memory cells to one or more programming states corresponding to v.

In one implementation, programming is configured to raise the threshold voltage of a memory cell to one of the programming data statuses L1 to L15. Erasing is to reduce the threshold voltage of a memory cell to the erase data status L0.

A technology for erasing memory cells in some memory devices is to bias the p-well (or other types) substrate to a high voltage to charge the NAND channel. An erase enable voltage is applied to the control gate of the memory cell and at the same time the NAND channel is kept at a high voltage to erase nonvolatile memory elements (memory cells). Another method for erasing memory cells is to generate a gate induced drain leakage (GIDL) current to charge the NAND string channel. An erase enable voltage is applied to the control gate of the memory cell, while the string channel is maintained at a high voltage to erase the memory cells.

In one implementation, band to band tunneling effect is caused by the voltage difference between the drain to the gate of the select transistor to generate electron-hole pairs, thereby producing gate induced drain leakage (GIDL) current. In one implementation, the GIDL current can cause one type of carriers such as holes primarily to move into the NAND channel, thereby raising the potential of the channel. Another type of carriers such as electrons are extracted from the channel by an electrical field in the direction of bit lines or source lines. During erasing, holes may tunnel from the channel into the charge storage region of a memory cell and recombine with electrons therein to reduce the threshold voltage of the memory cell.

The GIDL current may be generated at either end of the NAND string. For example, the voltage difference between two terminals of the select transistor (such as the drain side select transistor) connected to the bit line may generate a first GIDL current. As another example, the voltage difference between two terminals of the select transistor (such as the source side select transistor) connected to the source line may generate a second GIDL current. Erasing based on the GIDL current at only one end of the NAND string is referred to as single-side GIDL erasing. Erasing based on the GIDL current at two ends of the NAND string is referred to as two-side GIDL erasing. It is to be noted that while programming a selected word line, the voltage applied to the selected word line (applied programming voltage Vpgm) is different from the voltage applied to the unselected word line, the top dummy word line, and the bottom dummy word line (applied pass voltage Vpass). Generally, Vpgm is not less than Vpass.

In this case, it is found via research that in a 3D memory, since adjacent word lines may be applied with different voltages or in different programming states, the resulting voltage difference between adjacent word lines generates hot carriers injected into high potential word lines from low potential word line, thereby raising the threshold voltage of the memory cell coupled to the high potential word line, which is known as the hot carrier injection effect.

For example, in a 3D NAND with 128 word line layers (numbered successively from top to bottom as WL0, WL1, WL2, . . . , WLN−1, N being an integer not less than 1), during the programming of memory cells coupled to word lines WL3 to WL127, the aforementioned hot carrier injection phenomenon is particularly obvious between word lines WL2 and word line WL1. Under the influence of such a hot carrier injection effect, the threshold voltage of the memory cell coupled to the word line WL1 in erase status will drift towards a positive direction (the erase status typically corresponds to a threshold voltage of negative value), and therefore the first readable distribution corresponding to the memory cell coupled to word line WL1 will be affected.

It is to be noted that the first readable distribution may refer to a voltage interval that can be used to read data on a memory cell in erase status between the threshold voltage distribution corresponding to the memory cell in erase status coupled to the word line WL1 and the threshold voltage distribution corresponding to the memory cell in the first programming data status, which may also be referred to as E0. As illustrated in FIG. 8, in a memory cell of QLC type, the voltage interval between the lower tail fin of the threshold voltage distribution corresponding to the data status L0 and the voltage Vr1 is the first readable distribution E0. It should be appreciated by one skilled in the art that for a memory cell of QLC type, there are two readable distributions between every two adjacent data statuses, in which the former readable distribution is configured to read data on the memory cell in the former data status, and the latter readable distribution is configured to read data on the memory cell in the latter data status. For example, readable distributions between data status L0 and data status L1 include E0 and E1, where E0 is the above-mentioned first readable distribution; E1 is the voltage interval between voltage Vr1 and the tail fin on the threshold voltage distribution corresponding to data status L1. In some embodiments, for a memory cell of QLC type, the total readable distributions may include: E0, E1, . . . , E29, altogether 30 readable distributions that may be denoted as Esum=E0+E1+ . . . +E29.

Figure 11:
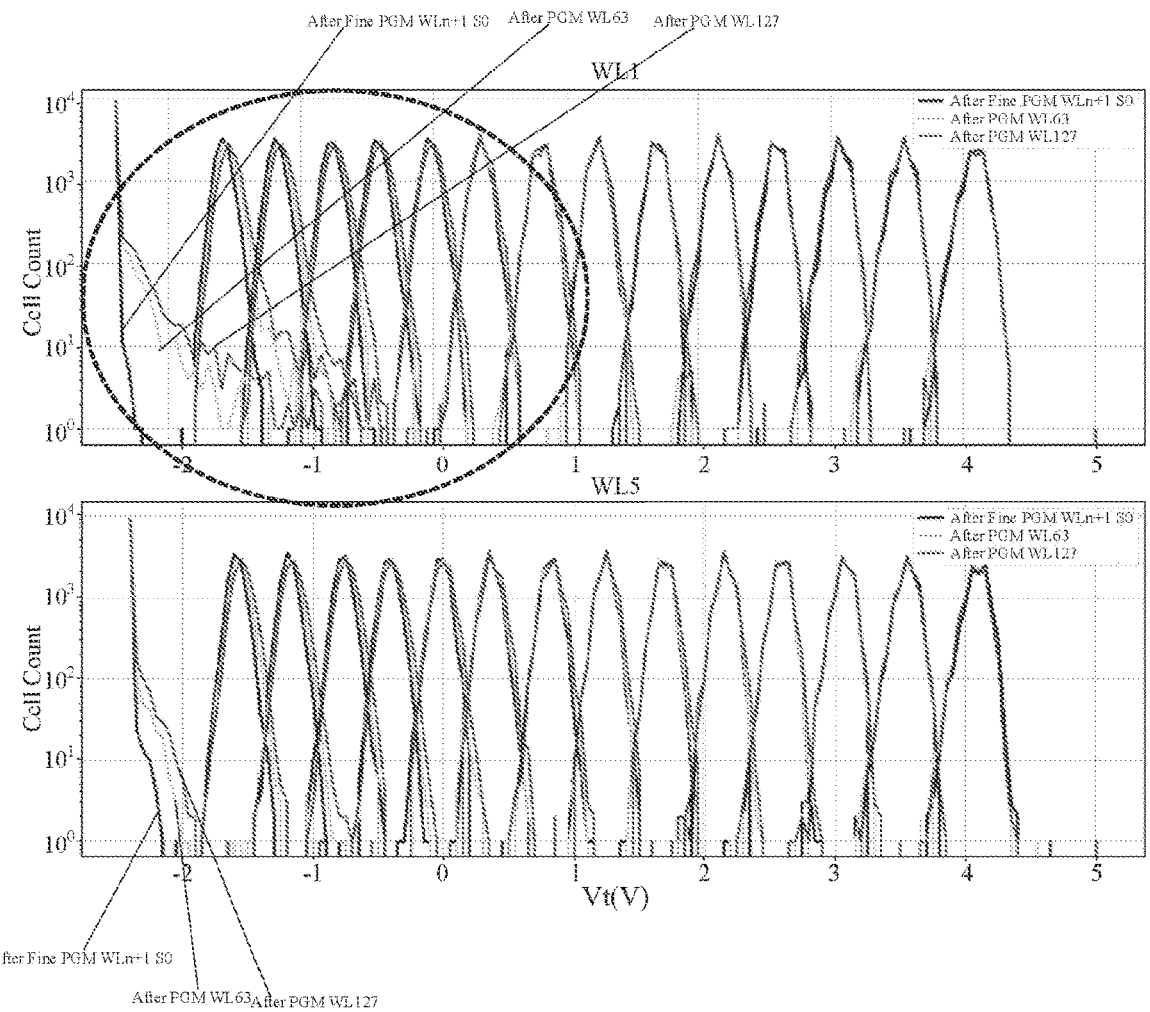
FIG. 11 is a diagram for revealing technical problems as provided in an embodiment of the present disclosure.

For example, as shown in FIG. 11, which shows a diagram of influence on word line WL1 and word line WL5 after programming different word lines for a memory having 128 layers of word lines. The "After fine PGM WLn+1" on the top represents fine programming of the word line adjacent to word line WL1 or word line WL5, in which fine programming is the last programming in multiple programming. "After PGM WL63" represents programming the memory cell coupled to WL63. "After PGM WL127" represents programming the memory cell coupled to WL127. As can be seen in FIG. 11, the threshold voltage of the memory cell coupled to word line WL1 shifts right severely while programming word line WL63 and word line WL1, and the E0 problem on word line WL is worse than the memory cell on word line WL5.

In the above-described case, particularly while applying QLC on the memory cell coupled to word line WL1 and memory cells coupled to word lines beyond WL1, during programming memory cells coupled to WL3 to WL127, hot carriers injected into word line WL1 from word line WL2 are generated due to the presence of a potential difference between the memory cell coupled to WL1 and in the lowest data status (L0) and the memory cell coupled to WL2 and in the highest data status (L15). Under the influence of the hot carrier injection effect, the threshold voltage of the memory cell coupled to word line WL1 and in the lowest data status (L0) shifts to the positive direction such that the first readable distribution E0 corresponding to the memory cell coupled to the word line WL1 and in the non-selected string experiences severe loss.

Figure 12:
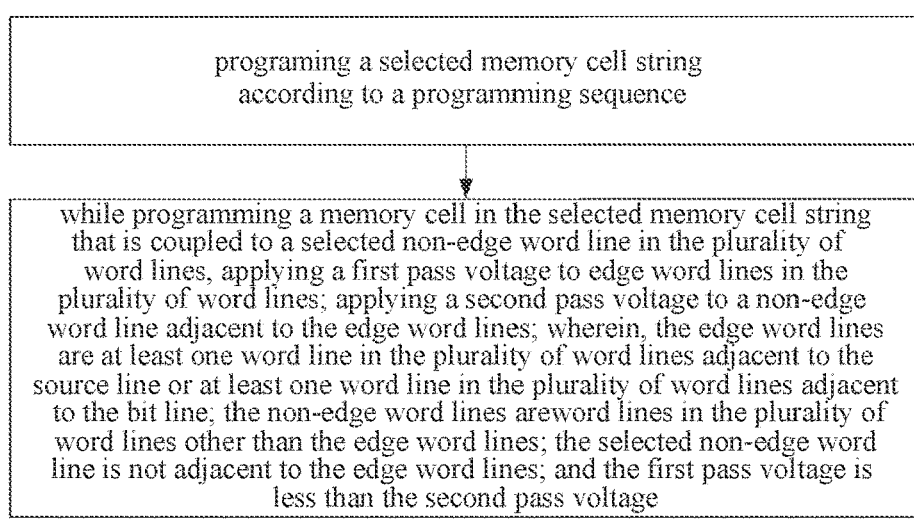
FIG. 12 is a flow chart of a method for programming the memory as provided in an embodiment of the present disclosure.

In order to address the above-described technical problem, as shown in FIG. 12, an embodiment of the present disclosure provides a method for programming memory that may specifically include: step 1201: programming a selected memory cell string according to the programming sequence; step 1202: while programming a memory cell in the selected memory cell string that is coupled to a selected non-edge word line in the plurality of word lines, applying a first pass voltage to edge word lines in the plurality of word lines; applying a second pass voltage to a non-edge word line adjacent to the edge word lines; where the edge word lines are at least one word line in the plurality of word lines adjacent to the source line or at least one word line in the plurality of word lines adjacent to the bit line; the non-edge word lines are word lines in the plurality of word lines other than the edge word lines; the selected non-edge word line is not adjacent to the edge word lines; and the first pass voltage is less than the second pass voltage.

Here, the memory includes: a plurality of memory cell strings each is connected with a bit line at one end and with a source line at the other end and includes a plurality of memory cells connected in series; where the plurality of memory cells are coupled with a plurality of word lines respectively. Herein, each memory cell has a bit line. A plurality of memory cell strings share a source line.

In step 1201, in some embodiments, the programming sequence includes forward programming and backward programming, where, the forward programming is to program memory cells in the selected memory cell string in turn from the memory cell adjacent to the source line to the memory cell adjacent to the bit line; the backward programming is to program memory cells in the selected memory cell string in turn from the memory cell adjacent to the bit line to the memory cell adjacent to the source line.

It is understood on the basis of the structure diagram shown in FIGS. 1 to 7 that the memory cell string is connected with the source line at one end and to the bit line at the other end. As defined herein, for memory cells in a memory cell string, programming in turn from the memory cell close to the bit line to the memory cell close to the source line is referred to as backward programming. For memory cells in a memory cell string, programming in turn from the memory cell close to the source line to the memory cell close to the bit line is referred to as forward programming. That is, the programming sequence in embodiments of the present disclosure may be forward or backward.

In step 1202, while programming a memory cell coupled with a selected non-edge word line, the first pass voltage is applied to the edge word lines, and the second pass voltage is applied to a non-edge word line adjacent to the edge word lines. Here, the first pass voltage is less than the second pass voltage such that the voltage difference between the edge word lines and the adjacent non-edge word line is reduced during programming, thereby in turn reducing HCl-type program disturb.

It is to be noted that in the above-described technical solution, the division of edge word lines and non-edge word lines is not constant, and they are a pair of relative concepts. In other words, for different memories 601, the defined edge word lines and non-edge word lines are different. Specifically, how to define edge word lines and non-edge word lines depends on the degree of influence by hot carrier injection on word lines in a memory (determined according to the loss of E0). One optional determination manner may be defining the word lines being influenced severely by hot carrier injection and word lines therebelow as edge word lines and defining the word lines being influenced not severely by hot carrier injection and word lines thereabove as non-edge word lines. For example, in some memories 601, edge word lines are defined as including WL0 and WL1 (as the memory array with the structure shown in FIG. 5(B)), then non-edge word lines include WL2 and word lines thereabove. As another example, edge word lines defined in some memories 601 include WL0, WL1, and WL2, then non-edge word lines include WL3 and word lines thereabove.

Figure 13:
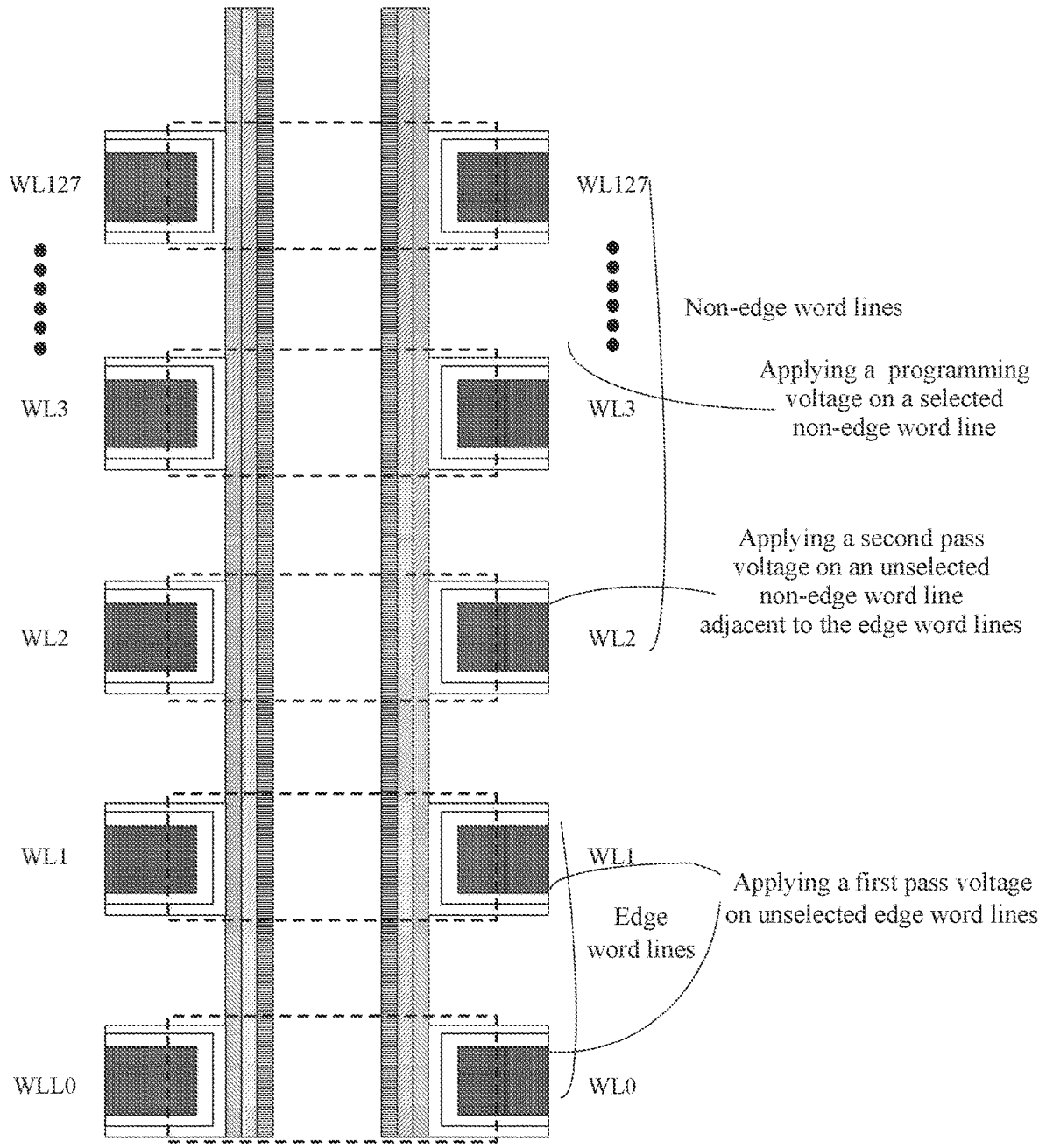
FIG. 13 is a flow chart of an optional implementation of applying a programming voltage and a pass voltage while programming the memory as provided in an embodiment of the present disclosure.

For example, in case edge word lines include word lines WL0 and WL1, non-edge word lines include WL2 and thereabove, and memory cells coupled to word lines WL1 and thereabove are those of QLC type, according to the programming method provided in embodiments of the present disclosure, while programming memory cells coupled to non-edge word line WL3 and word lines thereabove, a first pass voltage may be applied on word lines WL0 and WL1, and a second pass voltage may be applied on word line WL2 to reduce the potential difference between word lines WL2 and WL1, thereby reducing influence on the first reading distribution of the memory cell in the unselected string that is coupled to word line WL1 as shown specifically in FIG. 13.

In some embodiments, the first pass voltages applied to each edge word line in the edge word lines may be different. For example, for the afore-mentioned edge word lines WL0 and WL1, the first pass voltage applied on word line WL0 is different from that applied on word line WL1, but both are smaller than the second pass voltage. That is, the first pass voltages may be a set of voltage values smaller than the second pass voltage. In some embodiments, in order to reduce the potential difference between edge word lines, it is possible that the closer an edge word line is from the substrate, the smaller the first pass voltage is applied on the edge word line. For example, for the aforementioned edge word lines WL0 and WL1, the first pass voltage applied on word line WL0 is smaller than that applied on word line WL1.

It is to be noted that the scenarios described herein all occur while programming the first memory cell coupled to the selected non-edge word line in the plurality of word lines.

In some embodiments, the programming method further includes applying third pass voltages on remaining non-edge word lines, where the third pass voltages include a set of voltages greater than the first pass voltage.

It is to be noted that as described herein, except for the non-edge word line adjacent to the edge word lines such as WL2, while programming a memory cell coupled with a selected non-edge word line in the plurality of word lines in the selected memory cell string, third pass voltages may be applied on remaining non-edge word lines. The third pass voltages are a set of voltages greater than the first pass voltage.

In some embodiments, in case the plurality of word lines are numbered as word line WL0, WL1, ..., WLm, ..., Wln, ... successively from the source line or the bit line, the programming method further includes: in case that the edge word lines include word line WL0 and word line WL1 and the selected non-edge word line is word line WLn, the third pass voltages applied to the unselected non-edge word lines WL2 to WLm are equal to the second pass voltage; and the third pass voltages applied to the unselected non-edge word lines WLn−4 to WLm are greater than the second pass voltage; where n is not less than 17; m is not greater than 15.

It is to be noted that the above-described way in which pass voltages are applied is to reduce program disturb caused by the applied pass voltages among other non-edge word lines while programming memory cells coupled to non-edge word line WL17 and any non-edge word line thereabove.

As an optional implementation, the pass voltages applied to other word lines while programming word line WLn are shown in Table 1 below.

In the table, Vpass7 is one form of the above-mentioned first pass voltages; Vpass6 is one form of the above-mentioned second pass voltage; Vpass1, Vpass2, Vpass3, and Vpass4 are a set of forms of the above-mentioned third pass voltages. It is to be noted that Vpass6 is also one of the third pass voltages. Herein, Vpass1 is greater than Vpass6; and Vpass6 is greater than Vpass7. Magnitudes of other pass voltages are specifically designed according to models of the chips. Vpgm is the programming voltage and is greater than all the pass voltages as described above.

TABLE 1

| Word line WL | Applied voltage |
| --- | --- |
| WLn&above | Vpass2 |
| WLn + 3 | Vpass2 |
| WLn + 2 | Vpass2 |
| WLn + 1 | Vpass3 |
| WLn | Vpgm |
| WLn − 1 | Vpass3 |
| WLn − 2 | Vpass4 |
| WLn − 3 | Vpass4 |
| WLn − 4&WL16 | Vpass1 |
| WL2 − WL15 | Vpass6 |
| WL0 − WL1 | Vpass7 |

With the programming method provided in embodiments of the present disclosure, by applying a pass voltage smaller than that applied on an adjacent non-edge word line (e.g., word line WL2) on edge word lines (e.g., WL0 and WL1), the potential difference between adjacent edge word line and adjacent non-edge word line (e.g., word lines WL1 and WL2) is reduced, thereby reducing HCI-type program disturb on edge word lines (e.g., word line WL1) during programming non-adjacent non-edge word lines (e.g., word line WL3).

Figure 14:
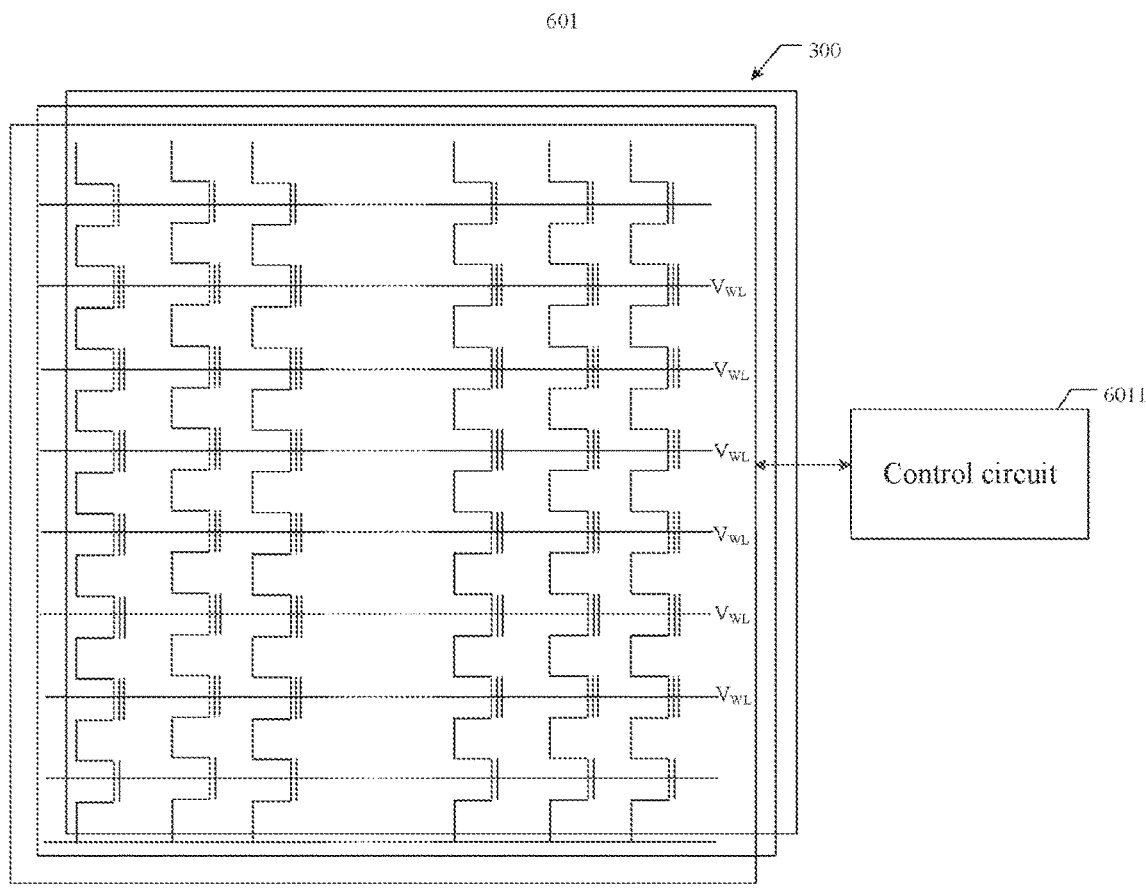
FIG. 14 is a flow chart of a method for programming the memory as provided in an embodiment of the present disclosure.

As shown in FIG. 14, an embodiment of the present disclosure provides a memory. The memory 601 includes a memory array including a plurality of memory cell strings each is connected with a bit line at one end and with a source line at the other end and includes a plurality of memory cells connected in series; where the plurality of memory cells are coupled with a plurality of word lines respectively; and a control circuit coupled to the memory array for controlling the memory array; where the control circuit is configured to: program a selected memory cell string according to a programming sequence; while programming a memory cell in the selected memory cell string that is coupled to a selected non-edge word line in the plurality of word lines, apply a first pass voltage to edge word lines in the plurality of word lines; apply a second pass voltage to a non-edge word line adjacent to the edge word lines; where the edge word lines are at least one word line in the plurality of word lines adjacent to the source line or at least one word line in the plurality of word lines adjacent to the bit line; the non-edge word lines are word lines in the plurality of word lines other than the edge word lines; the selected non-edge word line is not adjacent to the edge word lines; and the first pass voltage is less than the second pass voltage.

It is to be noted that the memory described in the above FIGS. 1 to 7 is only for illustrating partial connection relationship among and partial working principle of memory cell strings, memory blocks, memory sub-blocks, word lines, and bit lines, etc., included in the memory rather than limiting the present disclosure. That is, the memory 601 described in embodiments of the present disclosure may be of the structure as described in FIGS. 1 to 7, and may also be other structures implemented with similar functions. In some embodiments, the plurality of word lines may be all contained in a first stack that further contains dielectric layers disposed alternatively with the word lines. That is, the first stack may be provided with word lines and dielectric layers disposed alternatively. In some embodiments, the material used for the plurality of word lines may be any of the word line materials described above; and the material used for the dielectric layers may be any of the dielectric layer materials described above.

In some embodiments, based on the above description, since etching the plurality of word lines blended with dielectric layers is expensive and/or challenging, in order to relax such burden, it is also possible in the memory provided in embodiments of the present disclosure to include the plurality of word lines in the first and second stacks and bond the first and second stacks with a bonding area, where the bonding area may have a material same as the word lines. In some embodiments, the numberings of word lines in the first stack are smaller than those of word lines in the second stack.

In some embodiments, in the memory provided in embodiments of the present disclosure, the selected non-edge word lines may be in the first stack or the second stack.

In some embodiments, the memory array in the memory provided in embodiments of the present disclosure may be a three-dimensional NAND memory array, or other 3D memory arrays.

In some embodiments, the control circuit is further configured to apply third pass voltages on remaining non-edge word lines, where the third pass voltages include a set of voltages greater than the first pass voltage.

In some embodiments, in case the plurality of word lines are numbered as word line WL0, WL1, ..., WLm, ..., Wln, ... successively from the source line or the bit line, the control circuit is further configured such that in case that the edge word lines include word line WL0 and word line WL1 and the selected non-edge word line is word line WLn, the third pass voltages applied to the unselected non-edge word lines WL2 to WLm are equal to the second pass voltage; and the third pass voltages applied to the unselected non-edge word lines WLn−4 to WLm are greater than the second pass voltage; where n is not less than 17 and m is not greater than 15.

In case the memory is a 3D NAND memory, in order to guarantee the read/write speed of a part, in some embodiments, memory cells coupled to the word line WL0 are one of the single-level cell (SLC), multi-level cell (MLC), and tri-level cell (TLC); and memory cells coupled to remaining word lines are quad-level cell (QLC). In some other embodiments, in order to guarantee memory capacity, each memory cell coupled into the plurality of word lines is set to one of multi-level cell MCL memory cell, TLC memory cell, QLC memory cell, and penta-level cell PLC memory cell. This is only a partial example setting, specific settings may be determined according to the customer's requirements.

It is to be noted that the memory and the aforementioned programming method belong to the same inventive concept and have the same technical features. Terms that appear in the memory have been explained in detail in the above-mentioned programming method and apply equally herein, and therefore will not be repeated.

With the memory provided in embodiments of the present disclosure, by applying a pass voltage smaller than that applied on an adjacent non-edge word line (e.g., word line WL2) on edge word lines (e.g., WL0 and WL1), the potential difference between adjacent edge word line and non-edge word line (e.g., word lines WL1 and WL2) is reduced, thereby reducing the HCI-type program disturb on edge word lines (e.g., word line WL1) during programming selected non-edge word lines (e.g., word line WL3 and anyone thereabove).

Figure 15:
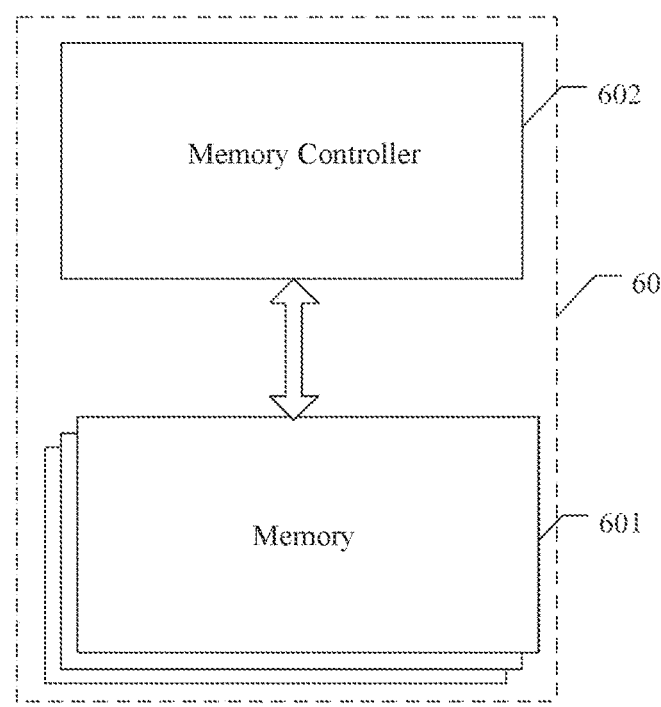
FIG. 15 is a structure diagram of a memory system provided in an embodiment of the present disclosure.

Based on the same inventive concept as above, as shown in FIG. 15, an embodiment of the present disclosure further provides a memory system 60 including a memory 601, the memory including a memory array including a plurality of memory cell strings each is connected with a bit line at one end and with a source line at the other end and includes a plurality of memory cells connected in series; where the plurality of memory cells are coupled with a plurality of word lines, respectively; and a control circuit coupled to the memory array for controlling the memory array; where the control circuit is configured to: program a selected memory cell string according to the programming sequence; when programming a memory cell in the selected memory cell string that is coupled to a selected non-edge word line in the plurality of word lines, apply a first pass voltage to edge word lines in the plurality of word lines; apply a second pass voltage to a non-edge word line adjacent to the edge word lines; where the edge word lines are at least one word line in the plurality of word lines adjacent to the source line or at least one word line in the plurality of word lines adjacent to the bit line; the non-edge word lines are word lines in the plurality of word lines other than the edge word lines; the selected non-edge word line is not adjacent to the edge word lines; and the first pass voltage is less than the second pass voltage; and, a memory controller 602 coupled to the memory and configured to control the memory.

Figure 16A:
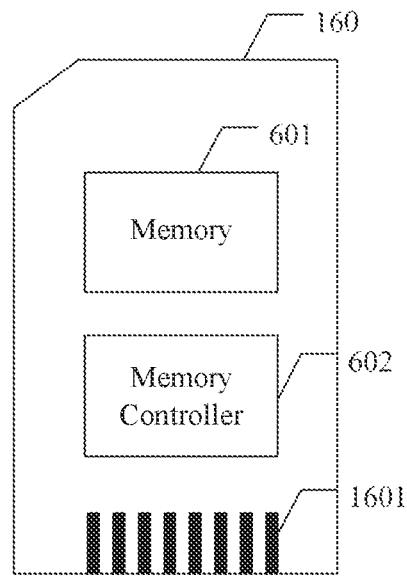
FIG. 16(A) is a diagram of an example memory card having the memory system as provided according to some aspects of the present disclosure.
Figure 16B:
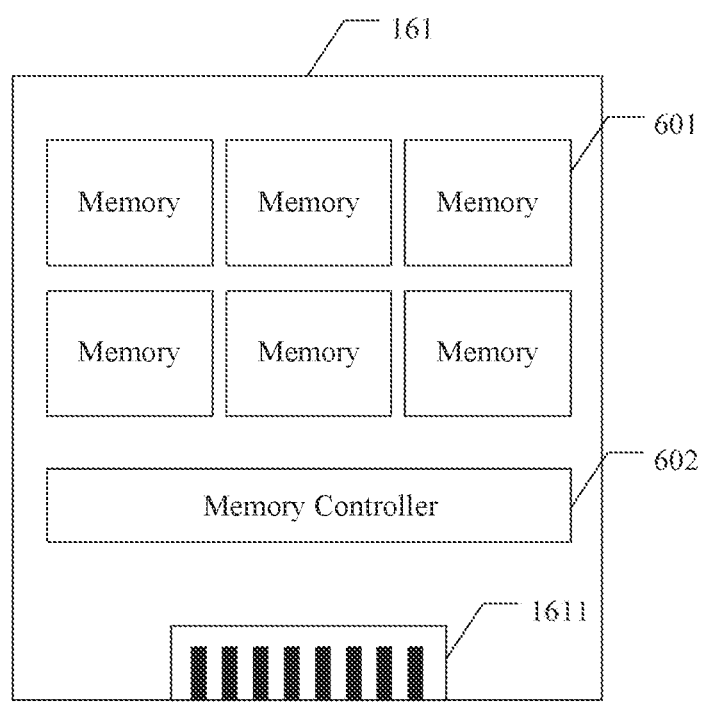
FIG. 16(B) is a diagram of an example solid state drive (SSD) having the memory system according to some aspects of the present disclosure.

It is to be noted that the memory system 60 may communicate with the host in the afore-mentioned FIG. 6. Herein, the host and/or the memory system 60 may be included in various products such as Internet of Things (IoT) devices such as refrigerators or other devices, sensors, motors, mobile communication devices, automobiles, unmanned cars for supporting processing, communication or control of products. In an embodiment, the memory system 60 may be a discrete memory or memory component of a host device. In some other embodiments, the memory system 60 may also be a part of an integrated circuit, such as a part of a system on-chip (SOC). At this time, the memory system 60 is stacked or otherwise assembled together with one or more components of the host. In some other embodiments, the aforementioned memory system may be implemented and encapsulated in products such as a memory card, a drive, etc., e.g., as shown in FIGS. 16(A) and 16(B), where FIG. 16(A) shows a diagram of an example memory card having the memory system provided according to some aspects of the disclosure; and FIG. 16(B) shows a diagram of an example solid state drive (SSD) having the memory system provided according to some aspects of the disclosure. In one example as shown in FIG. 16(A), the memory controller 602 and a single memory 601 of the memory system may be integrated into the memory card 160. The memory card 160 may include a PC card (PCMCIA, Personal Computer Memory Card International Association), a CF card, a smart media (SM) card, a memory stick, a multimedia card (MMC, MMCmicro), an SD card (SD, mini SD, microSD, SDHC), a UFS, etc. The memory card 160 may also include a memory card connector 1401 coupling the memory card 160 and the host (e.g., the host in FIG. 6). In another example shown in FIG. 16(B), the memory controller 602 and the plurality of memories 601 may be integrated into an SSD 161. The SSD 161 may also include an SSD connector 1611 coupling the SSD 161 and the host (e.g., the host in FIG. 6). In some implementations, the memory capacity and/or operating speed of SSD 161 are greater than the memory capacity and/or operating speed of the memory card 160.

In some embodiments, the host may include a processor and a host RAM, where the host RAM may include DRAM, SDRAM, or any other suitable volatile or non-volatile memory devices. The memory system 60 may be provided with one or more communication interfaces for communicating with one or more components in the host. The one or more components in the host may be Serial Advanced Technology Attachment (SATA) interfaces, Peripheral Component Interconnect Express (PCIe) interfaces, Universal Serial Bus (USB) interfaces, Universal Flash Storage (UFS) interfaces, eMMCTM interfaces, etc. The host may further include electronic components, a memory card reader, or one or more other electronic components external to the memory system 60.

In some embodiments, the memory controller 602 may receive instructions from the host and communicate with the memory 601. For example, the memory controller 602 transfers data to one or more memory cells, planes, sub-blocks, blocks, or pages in the memory 601 by executing write or erase instructions; or the memory controller 602 transfers data to the host by executing read instructions. With respect to hardware, the memory controller 602 may include one or more controller units, circuits, or components configured to control access across the memory 601 and provide a transform layer between the host and the memory system 60. The memory controller 602 may further include one or more input/output (I/O) circuits, wires, or interfaces to transfer data to the memory 601 or transfer data from the memory 601. The memory controller 602 may further include a memory management unit and an array control unit.

The memory management unit may include circuit hardware or firmware such as a plurality of components or integrated circuits associated with various memory management functions. The memory system operation or management functions will be described with NAND memory as an example. It should be appreciated by those skilled in the art that other forms of non-volatile memories may have similar memory operation or management functions. Herein, the management functions of a NAND memory may include wear-leveling such as waste collection or recovery, error detection or correction, block rollback, or a plurality of other memory management functions. The memory management unit may process the host's instructions into commands recognizable by the memory system 60, for example, resolving or formatting instructions received from the host into commands related to operations of the memory 601, etc. Alternatively, the memory management unit may also generate device commands for the array control unit or one or more other components of the memory system 60, such as commands for implementing various memory management functions.

The memory management unit may be configured to include a set of management tables for maintaining various information associated with one or more components of the memory system 60, such as various information associated with the memory array coupled to the memory controller 602 or one or more memory cells. For example, the management tables may contain information such as block ages, block erasing counts, error histories, or one or more error counts of one or more blocks of the memory cells coupled to the memory controller 602. Herein, the error counts may include operation error counts, bit reading error counts, etc. In some embodiments, in case that a detected error count is above a certain threshold, the bit error is uncorrectable. In some embodiments, the management tables maintain the count of the correctable or uncorrectable bit errors, etc. The management tables may further contain one or more L2P tables containing one or more L2P pointers associated with physical addresses at the memory 601 with logical addresses. In some embodiments, the management tables may contain unencrypted L2P tables and/or encrypted L2P tables. Unencrypted L2P tables may include L2P pointers indicating unencrypted logical addresses and unencrypted physical addresses; and encrypted L2P tables may include encrypted L2P pointers of encrypted physical addresses and unencrypted logical addresses. In a practical application process, the management tables may be shown in the memory management unit. That is, the management tables may be stored in the RAM of the memory controller 602. In some other implementations, the management tables may also be stored in the memory 601. In use, the memory management unit may read partial or all buffered management tables from the RAM of the memory controller 602; and may also read the management tables from the memory 601.

The array control unit may include circuitries or components configured to control to complete the following related memory operations. For example, the array control unit controls writing data into one or more memory cells in the memory system 60 coupled with the memory controller 602, reading data from the one or more memory cells, or erasing the one or more memory cells. The array control unit may receive commands sent by the host, or host commands generated inside the memory management unit, where host commands may be commands associated with wear-leveling, error detection, or correction.

The array control unit may further include an error correction code (ECC) component containing an ECC engine or other circuitries for detecting or correcting the following related errors that may be errors that might occur during the process of writing data into one or more memory cells in the memory system 60 coupled to the memory controller 602 or reading data from the one or more memory cells. The memory controller 602 is configured to effectively detect error events related to various operations or data storage such as bit errors, operation errors, etc., and restore from the error events, and at the same time maintain the integrity of data transferred between the host and the memory system 60 or maintain the integrity of the stored data by for example using redundant RAID storage, and can remove, for example, withdraw memory resources with failures, such as memory cells, memory array, pages, blocks, etc. for preventing future errors.

In some embodiments in which the plurality of word lines are all contained in the first stack, the first stack further includes dielectric layers disposed alternatively with word lines.

In some embodiments in which the plurality of word lines are contained in the first stack and the second stack, the numberings of word lines in the first stack are smaller than those of word lines in the second stack.

In some embodiments, the selected non-edge word lines are in the first stack or the second stack.

In some embodiments, the memory array is a three-dimensional NAND memory array.

It is to be noted that the memory system includes the aforementioned memory and thus both of them have the same technical features. Terms that appear with regard to the memory system have been explained in detail in relation to the above-mentioned memory and apply equally herein, and therefore will not be repeated.

The above description is intended to be illustrative rather than restrictive. For example, the above-described examples (or one or more aspects thereof) may be used in combination with each other. Other embodiments may be used, such as those available for one of ordinary skill in the art upon reading the above description. It should be understood that it will not be used to interpret or limit the scope or meaning of the claims. Furthermore, in the above-detailed description, various features may be combined to simplify the present disclosure. It should not be understood as meaning the disclosed features that have not been claimed are essential for any claims. On the contrary, the disclosed subject may lie in less than all features of specifically disclosed embodiments. Accordingly, the appended claims are hereby incorporated in the detailed description, where each claim serves as a separate embodiment independently and it is contemplated these embodiments may be combined with each other in various combinations or permutations. The scope of the scope of the present disclosure should be determined by the full scope of the appended claims and equivalents accorded by these claims.

What is claimed is:

1. A programming method for a memory, wherein the memory comprises a plurality of memory cell strings, with each string connecting with a bit line at one end and with a source line at the other end and each string comprising a plurality of memory cells connected in series, wherein the plurality of memory cells are respectively coupled with a plurality of word lines, the programming method comprises:
   programming a selected memory cell string according to a programming sequence;

applying, when programming a memory cell in the selected memory cell string that is coupled to a selected non-edge word line in the plurality of word lines, a first pass voltage to edge word lines in the plurality of word lines; and applying a second pass voltage to a non-edge word line adjacent to the edge word lines, wherein:
- the edge word lines are at least one word line in the plurality of word lines adjacent to the source line or at least one word line in the plurality of word lines adjacent to the bit line;
- the non-edge word lines are word lines in the plurality of word lines other than the edge word lines;
- the selected non-edge word line is not adjacent to the edge word lines; and
- the first pass voltage is less than the second pass voltage.

2. The programming method of claim 1, the programming method further comprises:
applying third pass voltages to remaining non-edge word lines, wherein the third pass voltages include a set of voltages greater than the first pass voltage.

3. The programming method of claim 2, in case that the plurality of word lines are numbered as word line WL0, WL1, ..., WLm, ..., Wln, ... successively from the source line or the bit line, the programming method further comprises, in case that the edge word lines comprise word line WL0 and word line WL1 and the selected non-edge word line is word line WLn:
- the third pass voltages applied to the unselected non-edge word lines WL2 to WLm being equal to the second pass voltage; and
- the third pass voltages applied to the unselected non-edge word lines WLn−4 to WLm being greater than the second pass voltage, wherein n is not less than 17 and m is not greater than 15.

4. The programming method of claim 3, the programming sequence comprises forward programming and backward programming, wherein:
- the forward programming is to program memory cells in the selected memory cell string in turn from the memory cell adjacent to the source line to the memory cell adjacent to the bit line; and
- the backward programming is to program memory cells in the selected memory cell string in turn from the memory cell adjacent to the bit line to the memory cell adjacent to the source line.

5. A memory, comprising:
a memory array comprising a plurality of memory cell strings, with each string being connected with a bit line at one end and a source line at the other end and each string comprising a plurality of memory cells connected in series, wherein the plurality of memory cells are respectively coupled with a plurality of word lines; and
a control circuit coupled to the memory array for controlling the memory array, wherein the control circuit is configured to:
program a selected memory cell string according to a programming sequence;
apply, when programming a memory cell in the selected memory cell string that is coupled to a selected non-edge word line in the plurality of word lines, a first pass voltage to edge word lines in the plurality of word lines; and
apply a second pass voltage to a non-edge word line adjacent to the edge word lines, wherein:
- the edge word lines are at least one word line in the plurality of word lines adjacent to the source line or at least one word line in the plurality of word lines adjacent to the bit line;
- the non-edge word lines are word lines in the plurality of word lines other than the edge word lines;
- the selected non-edge word line is not adjacent to the edge word lines; and
- the first pass voltage is less than the second pass voltage.

6. The memory of claim 5, the control circuit is further configured to apply third pass voltages on remaining non-edge word lines, wherein the third pass voltages comprise a set of voltages greater than the first pass voltage.

7. The memory of claim 6, in case that the plurality of word lines are numbered as word line WL0, WL1, ..., WLm, ..., Wln, ... successively from the source line or the bit line, the control circuit is further configured such that, in case that the edge word lines comprise word line WL0 and word line WL1 and the selected non-edge word line is word line WLn:
- the third pass voltages applied to the unselected non-edge word lines WL2 to WLm are equal to the second pass voltage; and
- the third pass voltages applied to the unselected non-edge word lines WLn−4 to WLm are greater than the second pass voltage, wherein n is not less than 17 and m is not greater than 15.

8. The memory of claim 7, the memory cells coupled to the word line WL0 are one of single level cell (SLC), multi-level cell (MLC), or tri-level cell (TLC); and
memory cells coupled to remaining word lines are quad-level cell (QLC).

9. The memory of claim 5, the programming sequence comprises forward programming and backward programming, wherein:
- the forward programming is to program memory cells in the selected memory cell string in turn from the memory cell adjacent to the source line to the memory cell adjacent to the bit line; and
- the backward programming is to program memory cells in the selected memory cell string in turn from the memory cell adjacent to the bit line to the memory cell adjacent to the source line.

10. A memory system, comprising: a memory; and
a memory controller coupled to the memory and configured to control the memory, wherein:
the memory comprises a memory array, the memory array comprises a plurality of memory cell strings, each string connects with a bit line at one end and with a source line at the other end, and each string comprises a plurality of memory cells connected in series, wherein the plurality of memory cells are respectively coupled with a plurality of word lines; and
a control circuit coupled to the memory array for controlling the memory array, wherein the control circuit is configured to:
program a selected memory cell string according to a programming sequence;
apply, when programming a memory cell in the selected memory cell string that is coupled to a selected non-edge word line in the plurality of word lines, a first pass voltage to edge word lines in the plurality of word lines; and apply a second pass voltage to a non-edge word line adjacent to the edge word lines, wherein:

the edge word lines are at least one word line in the plurality of word lines adjacent to the source line or at least one word line in the plurality of word lines adjacent to the bit line;

the non-edge word lines are word lines in the plurality of word lines other than the edge word lines;

the selected non-edge word line is not adjacent to the edge word lines; and the first pass voltage is less than the second pass voltage.

11. The memory system of claim 10, the control circuit is further configured to apply third pass voltages on remaining non-edge word lines, wherein the third pass voltages comprise a set of voltages greater than the first pass voltage.

12. The memory system of claim 11, in case that the plurality of word lines are numbered as word line WL0, WL1, ..., WLm, ..., Wln, ... successively from the source line or the bit line, the control circuit is further configured such that, in case that the edge word lines comprise word line WL0 and word line WL1 and the selected non-edge word line is word line WLn:

the third pass voltages applied to the unselected non-edge word lines WL2 to WLm are equal to the second pass voltage; and the third pass voltages applied to the unselected non-edge word lines WLn–4 to WLm are greater than the second pass voltage, wherein n is not less than 17 and m is not greater than 15.

13. The memory system of claim 12, the memory cells coupled to the word line WL0 are one of single level cell (SLC), multi-level cell (MLC), or tri-level cell (TLC); and memory cells coupled to remaining word lines are quad-level cell (QLC).

14. The memory system of claim 10, the programming sequence comprises forward programming and backward programming, wherein:

the forward programming is to program memory cells in the selected memory cell string in turn from the memory cell adjacent to the source line to the memory cell adjacent to the bit line; and the backward programming is to program memory cells in the selected memory cell string in turn from the memory cell adjacent to the bit line to the memory cell adjacent to the source line.

* * * * *